(12) United States Patent
Tanizawa

(10) Patent No.: US 7,612,699 B2
(45) Date of Patent: Nov. 3, 2009

(54) A/D CONVERTER CIRCUIT AND A/D CONVERSION METHOD

(75) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/153,218

(22) Filed: May 15, 2008

(65) Prior Publication Data

US 2008/0284633 A1 Nov. 20, 2008

(30) Foreign Application Priority Data

May 17, 2007 (JP) ............................. 2007-131946
Oct. 9, 2007 (JP) ............................. 2007-263296

(51) Int. Cl.
*H03M 1/60* (2006.01)
(52) U.S. Cl. ...................................... 341/157; 341/155
(58) Field of Classification Search ................. 341/157, 341/155, 156, 120
See application file for complete search history.

(56) References Cited

U.S. PATENT DOCUMENTS

| | | | |
|---|---|---|---|
| 5,142,238 A | | 8/1992 | White |
| 5,396,247 A | * | 3/1995 | Watanabe et al. ........... 341/157 |
| 5,867,777 A | | 2/1999 | Yamaji et al. |
| 6,392,475 B1 | | 5/2002 | Lee |
| 6,466,151 B2 | | 10/2002 | Nishii et al. |
| 6,771,202 B2 | | 8/2004 | Watanabe et al. |
| 6,850,178 B2 | | 2/2005 | Watanabe |
| 6,861,967 B2 | | 3/2005 | Tanizawa |
| 6,879,278 B2 | | 4/2005 | Watanabe et al. |
| 6,891,491 B2 | | 5/2005 | Nakamura et al. |
| 6,940,443 B2 | | 9/2005 | Terazawa et al. |
| 2002/0060638 A1 | * | 5/2002 | Nishii et al. ................. 341/157 |
| 2004/0130377 A1 | | 7/2004 | Takeda et al. |
| 2005/0057388 A1 | * | 3/2005 | Terazawa et al. ............ 341/157 |
| 2005/0285769 A1 | | 12/2005 | Harada et al. |
| 2007/0080844 A1 | | 4/2007 | Terazawa et al. |

FOREIGN PATENT DOCUMENTS

| | | |
|---|---|---|
| JP | A-05-037378 | 2/1993 |
| JP | A-05-243857 | 9/1993 |
| JP | A-08-075876 | 3/1996 |
| JP | A-2004-222018 | 8/2004 |
| JP | A-2006-157105 | 6/2006 |

OTHER PUBLICATIONS

U.S. Appl. No. 12/153,219, filed May 15, 2008, Tanizawa.

(Continued)

*Primary Examiner*—Rexford N Barnie
*Assistant Examiner*—Joseph Lauture
(74) *Attorney, Agent, or Firm*—Posz Law Group, PLC

(57) ABSTRACT

An A/D converter circuit uses first and second ring delay lines. The first and second ring delay lines are supplied with input signals, which increase/decrease oppositely from each other with respect to change directions. In each ring delay line, a first counter counts the number of times of circulation of a pulse signal circulating therein to find a digital data, and a last digital data is subtracted from a present digital data. By adding the resulting first and second digital data of the first and second ring delay lines, a digital data of the input voltage of linear characteristics is provided.

14 Claims, 15 Drawing Sheets

OTHER PUBLICATIONS

Office Action mailed Jan. 20, 2009 in corresponding Japanese patent application No. 2007-263296 (and English translation).
Extended European Search Report dated Sep. 2, 2008 in corresponding European patent application No. 08009034.3-2206.

Balestrieri et al., *A State of the Art on ADC Error Compensation Methods*, IEEE Transactions on Instrumentation and Measurement, vol. 54, No. 4, Aug. 2005.

* cited by examiner

A/D CONVERTER CIRCUIT AND A/D CONVERSION METHOD

CROSS REFERENCE TO RELATED APPLICATION

This application is based on and incorporates herein by reference Japanese Patent Applications No. 2007-131946 filed on May 17, 2007 and No. 2007-263296 filed on Oct. 9, 2007.

FIELD OF THE INVENTION

This invention relates to an A/D converter circuit and an A/D conversion method for converting an analog voltage signal input to an input signal line into a binary digital data and outputting it to an output data line.

BACKGROUND OF THE INVENTION

An A/D converter circuit for converting an analog voltage signal input to an input signal line into a binary digital data and outputting it to an output data line is disclosed in, for example, U.S. Pat. No. 5,396,247 (JP 3,064,644). In this A/D converter circuit, a plurality of inverting circuits is connected like a ring to constitute a pulse circulating circuit. An input voltage which is an analog input is applied as a power supply voltage to each of the inverting circuits to convert the input voltage into a digital data by utilizing the fact that an inverting operation time of the inverting circuits varies depending upon the power supply voltage.

However, according to the A/D converter circuit of this type, even if the input voltage is linearly varying, the A/D-converted output (digital data) varies non-linearly since the delay time of the inverting circuits constituting the pulse circulating circuit does not linearly vary relative to a change in the power supply voltage.

According to a method of correcting non-linearity and an apparatus for correcting non-linearity of the A/D-converted output data, as disclosed in U.S. Pat. No. 6,891,491 (JP 2004-274157A), an approximated straight line or curve is calculated or corrected based on a digital operation to suppress variation in the digital data caused by non-linear delay characteristics for a change in the power supply voltage.

According to the latter prior art, however, it is necessary to repeat a predetermined arithmetic operation for every A/D conversion to digitally operate the approximated straight line or curve. Therefore, even if a variation in the digital data caused by non-linear delay characteristics of the inverting circuit could be suppressed, the scale of the arithmetic processing circuit increases and, besides, an extended period of time is required for the operation that is complex and that occurs repetitively. Thus, this technology is not suited for high-speed A/D conversion processing.

The above problem may be technically solved by utilizing a GaAs device capable of executing the arithmetic operation at high speeds for the arithmetic processing circuit. However, the cost of the GaAs device itself and the presence of the pulse circulating circuit that does not require high-speed processing necessitate a new step in the process for producing semiconductors. This will increase the cost of production.

SUMMARY OF THE INVENTION

It is therefore an object of the present invention to provide an A/D converter circuit and an A/D conversion method, which improves linearity in an A/D conversion output without requiring complicated operation.

According to the present invention, an A/D converter circuit and an A/D conversion method are provided to convert an analog voltage signal input to an input signal line into a binary digital data and outputting the same to an output data line. In the circuit and method, the analog voltage signal is supplied to a first pulse circulating circuit in which a plurality of inverting circuits is coupled in a ring form, so that the plurality of inverting circuits operate with the analog voltage signal and circulates a pulse signal therein. The number of times of circulation of the pulse signal in the first pulse circulating circuit is counted and a first counted value is output. From a present data of a first counted value counted presently, a last data of a first counted value counted at a time point one period before the present data is output is subtracted. A subtraction result is output as a first digital data. The analog voltage signal is inverted to output an inverted analog voltage signal, which oppositely increases and decreases relative to the analog voltage signal, and the inverted analog voltage signal is supplied to a second pulse circulating circuit, which is similarly configured as the first pulse circulating circuit. The number of times of circulation of the pulse signal in the second pulse circulating circuit is counted and output as a second counted value. From a present data of a second counted value counted presently, a last data of a second counted value counted at a time point one period before the present data is subtracted and a subtraction result is output as a second digital data. The first digital data and the second digital data are combined and a combined result is output to the output data line as the binary digital data.

BRIEF DESCRIPTION OF THE DRAWINGS

The above and other objects, features and advantages of the present invention will become more apparent from the following description made with reference to the accompanying drawings. In the drawings.

DETAILED DESCRIPTION OF THE PREFERRED EMBODIMENTS

First Embodiment

Figure 1:
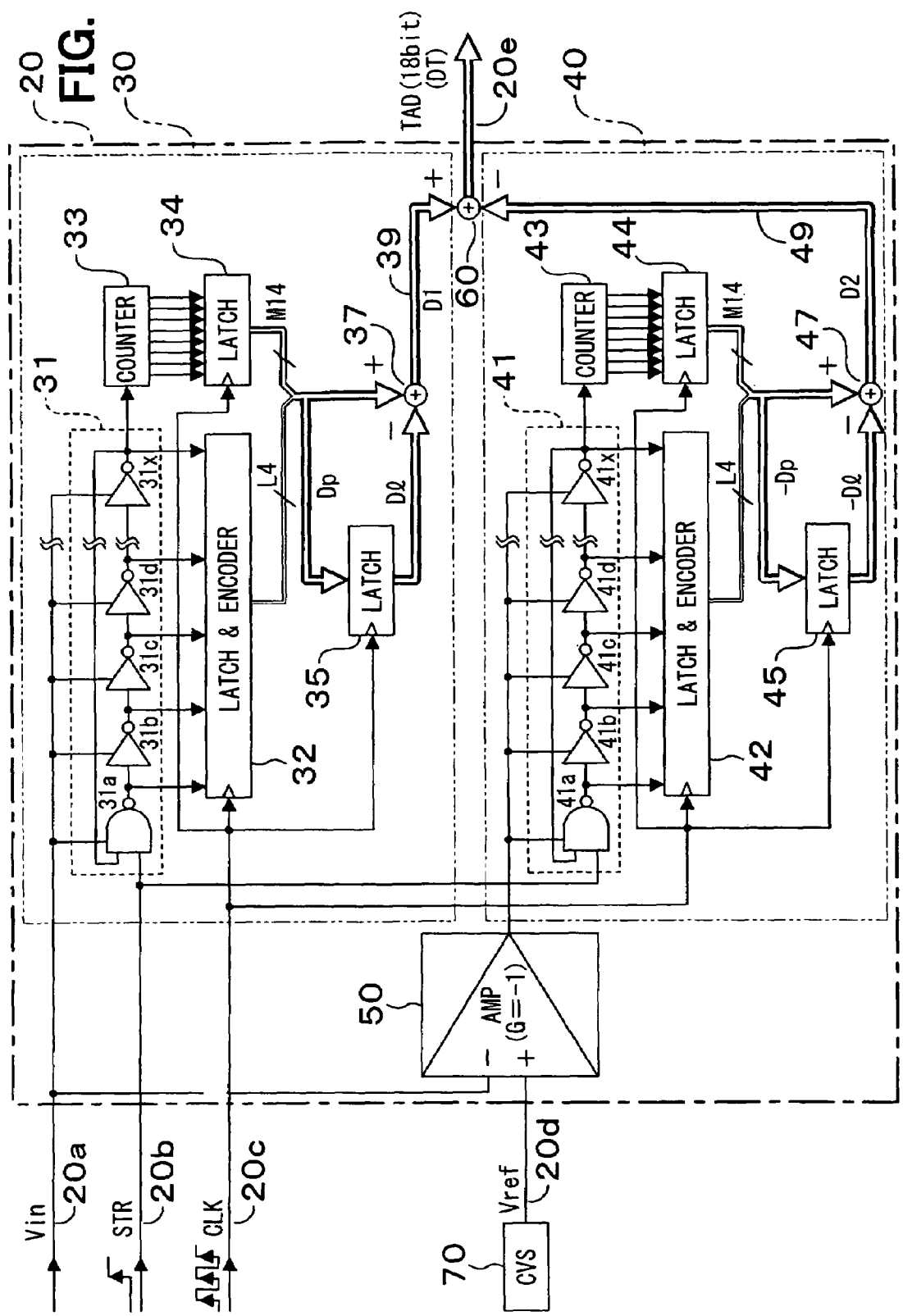
FIG. 1 is a circuit diagram showing an A/D converter circuit according to a first embodiment of the invention.

Referring first to FIG. 1, an A/D converter circuit 20 is configured by a first converter unit 30, a second converter unit 40 and an inverting amplifier 50, and operates to convert an analog input voltage Vin input to an input line 20a into a binary digital data DT and to output it to an output line 20e.

The first converter unit 30 converts the analog input voltage Vin input to the input line 20a into a binary first digital data and outputs it to a first conversion output line 39, and is configured by a first ring delay line 31, a first latch and encoder 32, a first counter 33, latches 34 and 35, and a digital arithmetic circuit 37. The first converter unit 30, as will be described below, utilizes the fact that the inverting operation time of the inverting circuits in the first ring delay line 31 differs depending upon the input voltage Vin.

Here, as will be described later, the first digital data D1 output to the first conversion output line 39 is produced by subtracting the data Dl of the last time from the present data Dp. The present data and the data of the last time are different with respect to only the time points output from the first latch and encoder 32 and from the latch 34. Therefore, when both the present data and the data of the last time are included as a concept of digital data, the data are expressed as "present data (data of the last time)".

The first ring delay line 31 is configured by coupling a plurality of inverting circuits 31a, 31b, 31c, 31d to 31x like a ring, the plurality of inverting circuits using the input voltage Vin input from the input line 20a as a power supply voltage (operation voltage) and of which the inverting operation time for inverting and outputting the input signal varying depending upon the power supply voltage. Here, one of the plurality of inverting circuits, such as the inverting circuit 31a, is configured as a NAND circuit 31a of which the inverting operation can be controlled from the outer side. The pulse signal circulates therein accompanying the start of operation of the NAND circuit 31a. The first ring delay line 31 thus operates as a first pulse circulating circuit.

Among the inverting circuits 31a, 31b, 31c, 31d to 31x, in order to distinguish the NAND circuit 31a over other inverting circuits 31b, 31c, 31d to 31x, the inverting circuits 31b, 31c, 31d to 31x will hereinafter be described as INV circuits 31b, 31c, 31d to 31x.

That is, the NAND circuit 31a and INV circuits 31b, 31c, 31d to 31x constituting the first ring delay line 31, are connected in series like a ring in order to convert the logical value of the input pulse signal (high level (Hi)→low level (Lo), Lo→Hi) and to output the signal to the next INV circuit, and are connected in parallel with the latch and encoder 32 so that the outputs of the NAND circuit 31a and of the INV circuits 31b, 31c, 31d to 31x can be input to the latch and encoder 32 in parallel.

The power supply voltage for driving the NAND circuit 31a and INV circuits 31b, etc. is not fed from a stabilized constant-voltage source, but is fed from the input line 20a. That is, the inverting circuits (NAND circuit 31a and INV circuits 31b, etc.) constituting the first ring delay line 31 receive, as a power supply voltage, the analog input voltage Vin that is to be converted into a first digital data D1, and its voltage level is subject to vary.

An output terminal of the last INV circuit 31x is connected to the one input terminal of the first NAND circuit 31a to cyclically input the signal thereto and is, further, connected to an input terminal of the first counter 33 so as to input the signal to the first counter 33, too. A start signal line 20b, on the other hand, is connected to the other input terminal of the NAND circuit 31a to which no signal is cyclically input. This enables the inverting operation of the NAND circuit 31a when the logic level of the start signal STR input from the start signal line 20b is in the Hi state and prohibits the inverting operation of the NAND circuit 31a when the logic level of the start signal STR is in the Lo state.

Based on the output signals output from the NAND circuit 31a and INV circuits 31b, 31c, 31d to 31x in the first ring delay line 31, the latch and encoder 32 detects a position where the pulse signal is circulating in the first ring delay line 31, and outputs the present data (data of the last time) corresponding to the circulating position, i.e., forms least significant (subordinate) data contributing to enhancing the resolution.

That is, the output terminals of the NAND circuit 31a and of the INV circuits 31b, 31c, 31d to 31x are connected to the parallel input terminals of the latch & and encoder 32, and the pulse signal circulating through the first ring delay line 31 is picked up by the logic level Hi or Lo input through these terminals to detect the position thereof (encoder function). As a latch signal, further, a sampling clock CLK is input to the latch and encoder 32 from an external unit. Therefore, the data of the circulating position of the pulse signal (e.g., a 4-bit least significant digital data L4 in this embodiment) that is detected is latched at the rising time point of the sampling clock CLK (latch signal), and is output to the latch 35 and to the digital arithmetic circuit 37 (latching function).

Therefore, the latch and encoder 32 holds, by the latching function, the digital data output by the encoder function as least significant 4 bits of the 18 bits which are part of the present data (data of the last time) at a time point of the rising edge (or falling edge) of the sampling clock CLK (latch signal), and outputs it to the latch 35 and to the digital arithmetic circuit 37.

The first counter 33 has a function for counting the number of times of circulation of the pulse signal circulating in the first ring delay line 31 and for outputting the counted value, and its input terminal is connected to the output terminal of the INV circuit 31x in the first ring delay line 31 and its output terminals are connected to the input terminals of the latch 34. Therefore, the number of times of circulation of the pulse signal circulating in the first ring delay line 21 is counted and the counted value is output to the latch 34.

The latch 34 has a function for outputting the counted value from the first counter 33 as most significant (superior) 14 bit data (M14) of the 18 bits which are the remainder of the present data (data of the last time) to the latch 35 and to the digital arithmetic circuit 37 at a time point of the rising edge (or falling edge) of the latch signal. Therefore, like the above first latch and encoder 32, the latch 34 receives the sampling clock CLK as a latch signal from the external unit. Therefore, the counted value output from the first counter 33 is latched at the same time point as the first latch and encoder 32, and is output to the latch 35 and to the digital arithmetic circuit 37.

The latch 35 has a function for latching the 18-bit present data configured by the most significant 14-bit data output from the first latch & and encoder 32 and least significant 4 bits output from the latch 34 at a time point of the rising edge (or falling edge) of the latch signal, and for outputting it as the data of the last time to the digital arithmetic circuit 37 at a time point of the rising edge (or falling edge) of the next latch signal, and receives the sampling clock CLK as a latch signal from the external unit. The latch 35 operates as the first latch.

The digital arithmetic circuit 37 has a function for digitally subtracting the data Dl of the last time once latched by the latch 35 and input thereto being delayed by a sampling clock CLK from the present data Dp that is directly input thereto from the first latch and encoder 32 and the latch 34, and for outputting the subtracted result as an 18-bit first digital data to the first conversion output line 39, and operates as a first operation means. Therefore, the first digital data output from the digital arithmetic circuit 37 is output as a difference between the present data and the data of the last time, i.e., output as an A/D-converted result.

By configuring the first converter unit 30 as described above, the analog input voltage Vin input to the input line 20a is converted into the binary first digital data D1 and is output from the first conversion output line 39.

Figure 3:
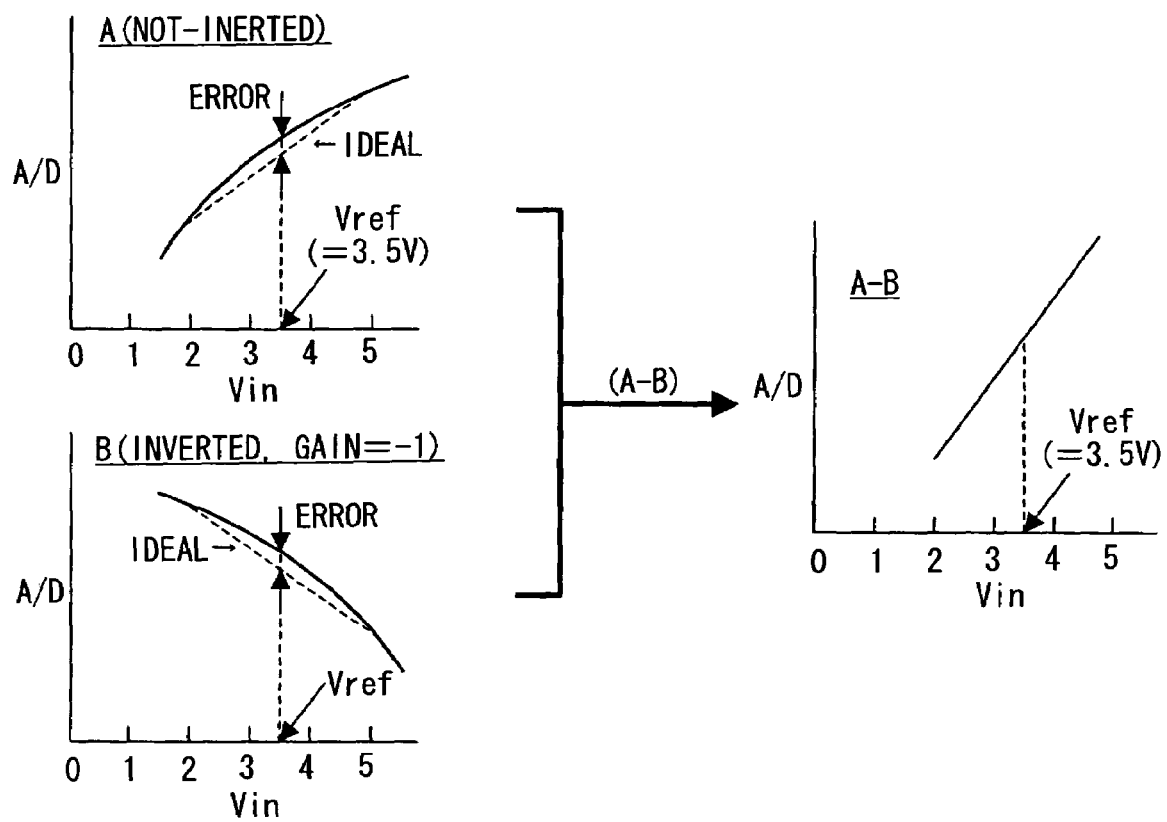
FIG. 3 is a set of graphs illustrating the concept of an operation principle of the A/D converter circuit according to the first embodiment.

As represented by the characteristics of the "case A of when not inverted" shown in FIG. 3 (graph of characteristics on the left upper side), however, even if the analog input voltage Vin is linearly varying, the A/D-converted value (first digital data) presents a convex curve and is output non-linearly. This is because, the inverting operation time (delay time) of the NAND circuit 31a and INV circuits 31b, 31c, 31d to 31x constituting the first ring delay line 31 is not linearly changing relative to a change in the power supply voltage.

Therefore, the A/D converter circuit 20 is provided with a second converter unit 40 configured in the same manner as the first converter unit 30. That is, as shown in FIG. 1, a second ring delay line 41 is configured in the same manner as the first ring delay line 31 in the first converter unit 30. A NAND circuit 41a and INV circuits 41b, 41c, 41d to 41x in the second ring delay line 41 correspond to the NAND circuit 31a, and INV circuits 31b, 31c, 31d to 31x in the first ring delay line 31, respectively. Further, a second latch and encoder 42, a second counter 43, latches 44 and 45, a digital arithmetic circuit 47 and a second conversion output line 49 in the second converter unit 40 are similarly configured so as to correspond to the first latch and encoder 32, first counter 33, latches 34 and 35, digital arithmetic circuit 37 and first conversion output line 39 in the first converter unit 30.

An inverting amplifier 50 is provided for inverting the input voltage Vin in the increasing/decreasing direction based on a reference voltage Vref (intermediate voltage) which is nearly at the center in the voltage range in which the first digital data value output from the digital arithmetic circuit 37 in the first converter unit 30 varies nearly constantly relative to a change in the power supply voltage. The inverted input voltage −Vin output from the inverting amplifier 50 is input to the second converter unit 40, i.e., input as a power supply voltage to the second ring delay line 41. In this invention, a symbol "−" preceding the voltage value means the inversion of increase or decrease in the analog voltage value relative to a reference voltage.

As shown in FIG. 3, the reference voltage Vref is set to be, for example, 3.5V. As represented by the characteristics of the "case B of when inverted" shown in FIG. 3 (diagram of characteristics on the left lower side), the second conversion output line 49 in the second converter unit 40 outputs the second digital data (=inverted data of the last time−present inverted data) as an A/D-converted value having characteristics inverting the positive and negative relative to the input voltage Vin with the reference voltage Vref as a center. Therefore, the first digital data D1 is digitally subtracted from the second digital data D2 through a digital arithmetic circuit 60.

That is, upon subtracting (A−B) the characteristics of the "case B when inverted" from the characteristics of the "case A when not inverted", the non-linearity possessed by the first digital data is canceled by the second digital data. Therefore, as shown in FIG. 3 (diagram of characteristics on the right side, the linearity of the binary digital data DT output from the digital arithmetic circuit 60 is improved as a result of subtraction "A−B".

The second ring delay line 41 operates as a second pulse circulating circuit, the latch 45 operates as a second latch, and the digital arithmetic circuit 47 operates as a second operation means. Further, the inverting amplifier 50 operates as an inverting means and the digital arithmetic circuit 60 operates as a third operation means.

Figure 2:
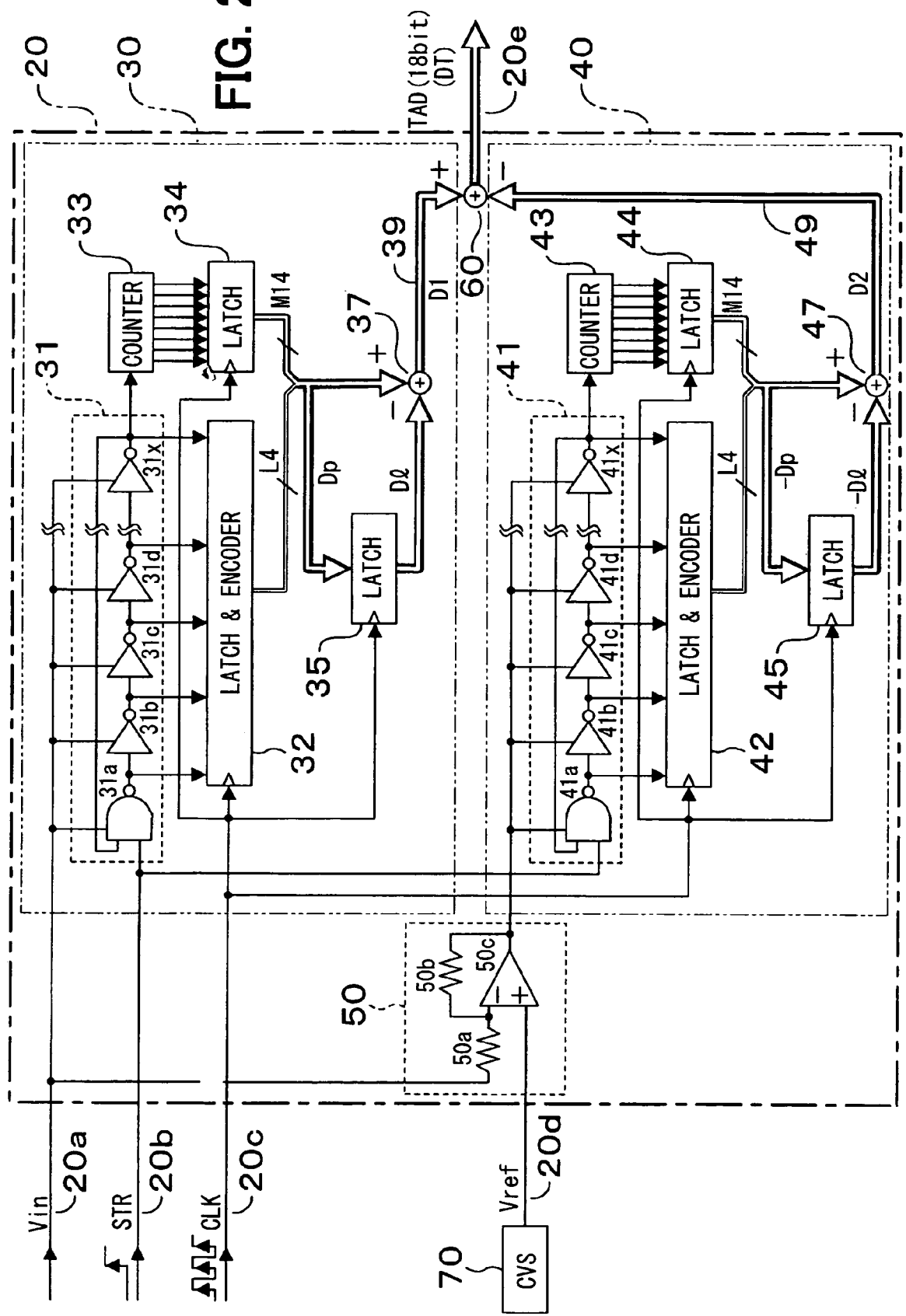
FIG. 2 is a circuit diagram showing an inverting amplifier shown in FIG. 1.

Here, as described above, the inverting amplifier 50 has a function for inverting the input voltage Vin in the increasing/decreasing direction based on the reference voltage Vref nearly at the center in a range of the power supply voltage where the first digital data value output from the digital arithmetic circuit 37 varies nearly constantly relative to the change in the power supply voltage. Specifically as shown in FIG. 2, the inverting amplifier 50 is configured by resistors 50a and 50b having the same resistance with an operational amplifier 50c as a center.

That is, the input is used as an inverting input of the operational amplifier 50c through the resistor 50a (=50b), the reference voltage Vref is used as a non-inverting input of the operational amplifier 50c, and the output of the operational amplifier 50c is negatively fed back to the inverting input through the resistor 50b (=50a). This constitutes an inverting amplifier having a gain 1. The input of the inverting amplifier 50 is connected to the input line 20a while the output of the inverting amplifier 50 is connected to respective power sources of the NAND circuit 41a and the INV circuits 41b, 41c, 41d, 41x that constitute the second ring delay line 41.

The operational amplifier 50c that constitutes the inverting amplifier 50 has an offset voltage that directly creates an error in the A/D conversion. It is, therefore, desired to constitute the operational amplifier 50c by using an auto-zero amplifier or a switched capacitor circuit having a function for correcting the offset voltage to become zero as much as possible. Auto-zero amplifiers are disclosed in, for example, U.S. Pat. No. 5,867,777 (JP 9-64666A) and U.S. Pat. No. 6,392,475 (JP 2002-76799A). The switched capacitor circuits are disclosed in, for example, JP 5-243857, U.S. Pat. No. 5,142,238 (JP 6-343013A), US 2004/0,130,377 (JP 2004-179875A) and JP 2004-222018A.

The reference voltage Vref is fed from a constant-voltage source (CVS) 70 of the band-gap type which uses, for example, a band-gap voltage as the reference voltage through a reference voltage line 20d. Therefore, the reference voltage Vref almost free of temperature variation is produced as an output voltage although the ambient temperature of the A/D converter circuit 20 undergoes the change.

The A/D converter circuit 20 is configured as described above, and the input voltage Vin to be A/D-converted is used as the power supply voltage for the NAND circuit 31a and INV circuits 31b, 31c, 31d to 31x in the first ring delay line 31.

Namely, the position of the pulse signal circulating in the first ring delay line 31 and the number of times of circulation differ depending upon the magnitude of the input voltage Vin. Therefore, the number of times of circulation of the pulse signal is counted by the first counter 33, and the data of the last time counted by the latch 35 one period before a predetermined period is subtracted from the present data which is the counted value through the digital arithmetic circuit 37 to find the first digital data D1.

Further, the input voltage Vin is inverted by the inverting amplifier 50 in the increasing/decreasing direction based on the reference voltage Vref which is nearly at the center in the voltage range of the power supply voltage where the first digital data value varies nearly constantly relative to a change in the power supply voltage. The thus inverted input voltage −Vin is used as the power supply voltage for the NAND circuit 41a and INV circuits 41b, 41c, 41d to 41x in the second ring delay line 41. Namely, the position of the pulse signal circulating in the second ring delay line 41 and the number of times of circulation differ depending upon the magnitude of the inverted input voltage −Vin. Therefore, the number of times of circulation of the pulse signal is counted by the second counter 43, and the inverted data of the last time counted by the latch 45 one period before a predetermined period is subtracted from the present inverted data which is the counted value through the digital arithmetic circuit 47 to find a second digital data D2. The second ring delay line 41 is configured in the same manner as the first ring delay line 31.

Namely, the second digital data has output characteristics inverted in the increasing/decreasing direction of the input voltage Vin based on the reference voltage Vref relative to the first digital data. Therefore, the subtracted result produced by subtracting the second digital data from the first digital data is output to the output line 20e as the binary digital data DT to thereby cancel the non-linearity of the first ring delay line 31 by the non-linearity of the second ring delay line 41. It is therefore made possible to improve the linearity of the A/D-converted output without requiring a complex operation.

Figure 4:
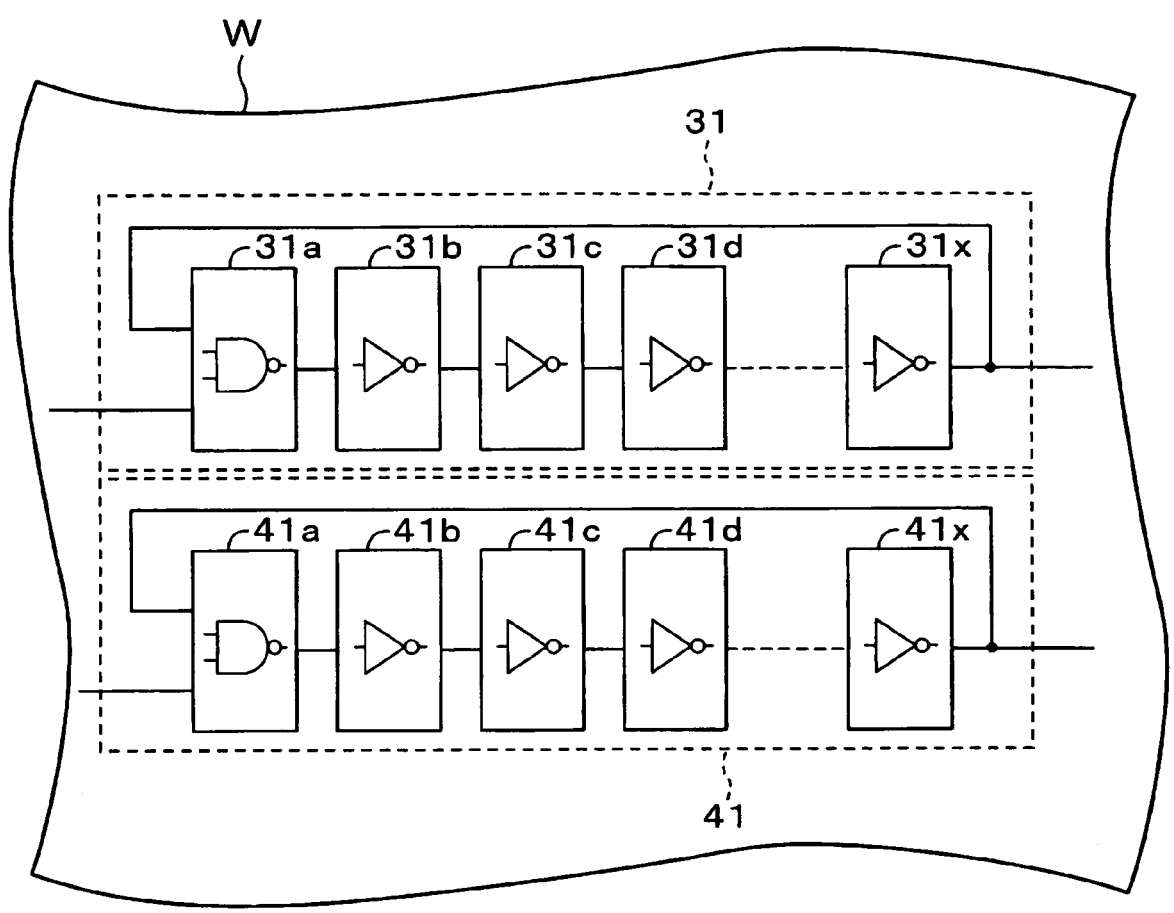
FIG. 4 is a diagram showing a first ring delay line and a second ring delay line shown in FIG. 1 on a semiconductor substrate.
Figure 5:
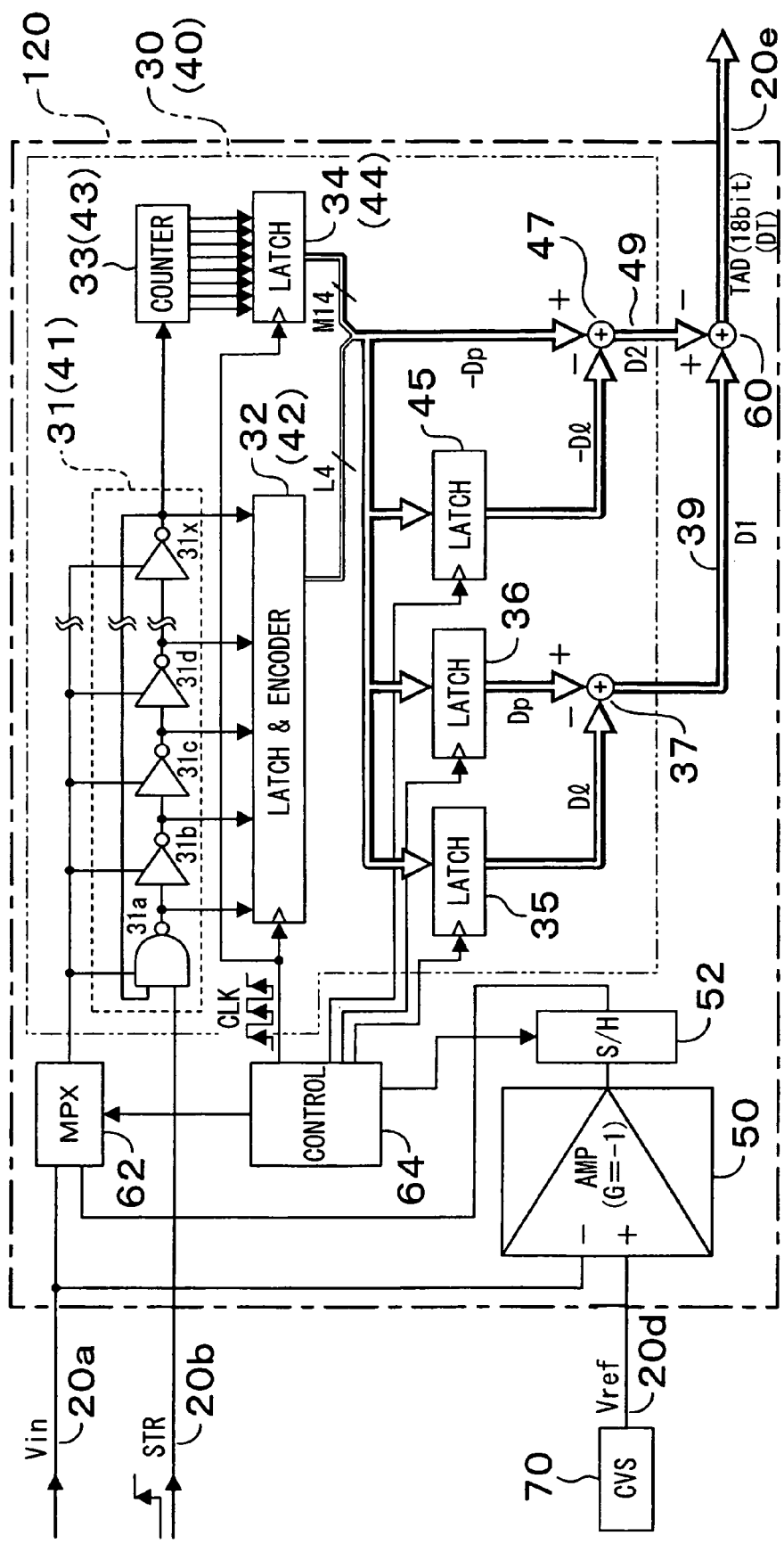
FIG. 5 is a circuit diagram showing an A/D converter circuit according to a second embodiment of the invention.

Referring to FIG. 4, the first ring delay line 31 in the first converter unit 30 and the second ring delay line 41 in the second converter unit 40 are arranged adjacent and in parallel on the same semiconductor substrate W. It is therefore made possible to decrease the characteristic-dispersing factors caused by the semiconductor processing such as photo etching among the characteristic-dispersing factors of the transistors constituting the NAND circuit 31a and INV circuits 31b, 31c, 31d to 31x in the first ring delay line 31. Therefore, the delay characteristics due to the NAND circuit 31a and INV circuits 31b, etc. in the first ring delay line 31 can be brought nearly in agreement with the delay characteristics due to the NAND circuit 41a and INV circuits 41b, etc. in the second ring delay line 41. This contributes to improve pair characteristics. Upon adjoining them together, further, the temperature conditions due to the generation of heat can be uniformed for the two circuits to effectively cancel the temperature characteristics.

Second Embodiment

According to a second embodiment, an A/D converter circuit 120 is different from the first embodiment with respect to that the second converter unit 40 is simplified. Therefore, the constituent portions substantially the same as those of the A/D converter circuit 20 of the first embodiment are denoted by the same reference numerals.

The A/D converter circuit 120 is configured by the first ring delay line 31, first latch and encoder 32, first counter 33, latches 34, 35, 36 and 45, digital arithmetic circuits 37, 47 and 60, inverting amplifier 50, sampling and holding circuit 52, multiplexer 62 and control circuit 64. Here, the first ring delay line 31 operates as a pulse circulating circuit, the first counter 33 operates as a counter, the latch 35 operates as a first latch, the latch 36 operates as a 1'-st latch, the digital arithmetic circuit 37 operates as a first operation means, the latch 45 operates as a second latch, the digital arithmetic circuit 47 operates as a second operation means, the inverting amplifier 50 operates as an inverting means, the sampling and holding circuit 52 operates as a voltage signal-holding means, the digital arithmetic circuit 60 operates as a third operation means, the multiplexer 62 operates as a signal selection means, and the control circuit 64 operates as a control means.

That is, the first ring delay line 31, first latch and encoder 32, first counter 33, latches 34, 35 and 36, and digital arithmetic circuit 37 constitute the first converter unit 30 in the A/D converter circuit 120. Further, the first ring delay line 31, first latch and encoder 32, first counter 33 and latch 34 together with the latch 45, digital arithmetic circuit 47 and second conversion output line 49 constitute the second converter unit 40 in the A/D converter circuit 120. Namely, the A/D converter circuit 120 shares the first ring delay line 31, first latch and encoder 32, first counter 33 and latch 34 between the two converter units 30 and 40.

In the A/D converter circuit 120, therefore, the multiplexer 62 is interposed between the input line 20a and the first ring delay line 31, and the sampling and holding circuit 52 is provided on the output side of the inverting amplifier 50. Further, the first latch and encoder 32, latches 34, 35, 36, 45, multiplexer 62, and sampling and holding circuit 52 are controlled by the sampling clocks CLK and control signals fed from the multiplexer 62.

Therefore, (1) the multiplexer 62 is so controlled by the control circuit 64 that the input line 20a is connected to the first ring delay line 31 and, thereafter, a rising (or falling) latch signal is input to the latch 35 at a rising (or falling) time point T1 of the sampling clock CLK that is input to the latch 34, whereby the input voltage Vin input to the first ring delay line 31 is A/D-converted and is latched by the latch 35 as the digital data Dl(data of the last time) at the time point T1.

(2) Thereafter, the multiplexer 62 is so controlled by the control circuit 64 that the output of the sampling and holding circuit 52 is connected to the first ring delay line 31 in synchronism with the rising (or falling) time point of the next sampling clock CLK. Thereafter, a rising (or falling) latch signal is input to the latch 45 at a rising (or falling) time point T2 of the sampling clock CLK that is input to the latch 34, whereby the input voltage Vin after inverted, i.e., the inverted input voltage −Vin once held in the sampling and holding circuit 52 at the last time point T1 is input to the first ring delay line 31 and is A/D-converted so as to be latched by the latch 45 as the digital data (inverted data of the last time).

(3) Further, the multiplexer 62 is so controlled by the control circuit 64 that the input line 20a is connected again to the first ring delay line 31 in synchronism with the rising (or falling) time point of the after next sampling clock CLK and, thereafter, a rising (or falling) latch signal is input to the latch 36 at a rising (or falling) time point T3 of the sampling clock CLK that is input to the latch 34, whereby the input voltage Vin input to the first ring delay line 31 is A/D-converted and is latched by the latch 36 as the digital data (present data Dp) at the time point T3.

(4) Further, the multiplexer 62 is so controlled by the control circuit 64 that the output of the sampling and holding circuit 52 is connected again to the first ring delay line 31 in synchronism with the rising (or falling) time point of the after next sampling clock CLK and, thereafter, the inverted input voltage −Vin once held in the sampling and holding circuit 52 at the last time point T3 is input to the first ring delay line 31 at a rising (or falling) time point T4 of the sampling clock CLK that is input to the latch 34, is A/D-converted, and is output to the digital arithmetic circuit 47 as the digital data (present inverted data −Dp).

The digital arithmetic circuit 37 digitally subtracts the data of the last time from the present data, and outputs the subtracted result as a first digital data D1 to the first conversion output line 39. Further, digital arithmetic circuit 47 digitally subtracts the inverted data of the last time −D1 from the present inverted data −Dp, and outputs the subtracted result as a second digital data D2 to the second conversion output line 49. Upon receipt of the first and second digital data, the digital arithmetic circuit 60 digitally subtracts the second digital data from the first digital data, and outputs the subtracted result to the output line 20e as a binary digital data DT.

As described above, the A/D converter circuit 120 includes the first ring delay line 31, first latch and encoder 32, first counter 33, latches 34, 35 and 36, and digital arithmetic circuit 37 that correspond to those in the first converter unit 30 in the A/D converter circuit 20 of the first embodiment. As described above, therefore, the input voltage Vin to be A/D-converted is used as the power supply voltage for the NAND circuit 31a and INV circuits 31b, 31c, 31d to 31x in the first ring delay line 31. Namely, the position of the pulse signal circulating in the first ring delay line 31 and the number of times of circulation differ depending upon the magnitude of the input voltage Vin. Therefore, the number of times of circulation of the pulse signal is counted by the first counter 33, and the data of the last time counted by the latch 35 one period before a predetermined period is subtracted from the present data which is counted by the first counter 33 and is latched by the latch 36 through the digital arithmetic circuit 37 to find the first digital data D1 which is output to the first conversion output line 39.

The A/D converter circuit 120 includes the first ring delay line 31 corresponding to the second ring delay line 41, first latch and encoder 32 corresponding to the second latch and encoder 42, first counter 33 corresponding to the second counter 43, latches 34 corresponding to the latch 44, latch 45 and digital arithmetic circuit 47 as what correspond to those of the second converter unit 40 in the A/D converter circuit 20 of the first embodiment. Further, it includes the sampling and holding circuit 52 positioned on the output side of the inverting amplifier 50. The input voltage Vin is inverted by the inverting amplifier 50 in the increasing/decreasing direction based on the reference voltage Vref which is nearly at the center in the range of the power supply voltage where the first digital data value varies nearly constantly relative to a change in the power supply voltage. The thus inverted input voltage −Vin is used as the power supply voltage for the NAND circuit 31a INV circuits 31b, 31c, 31d to 31x in the first ring delay line 31 which operates as the second ring delay line 41. Namely, the position of the pulse signal circulating in the first ring delay line 31 and the number of times of circulation differ depending upon the magnitude of the inverted input voltage −Vin. Therefore, the number of times of circulation of the pulse signal is counted by the first counter 33 which operates as the second counter 43, and the inverted data of the last time −D1 which is the counted value latched by the latch 45 one period before a predetermined period is subtracted from the present inverted data −Dp which is the counted value counted by the first counter 33 that operates as the second counter 43 through the digital arithmetic circuit 47 to find the second digital data D2 which is output to the second conversion output line 49.

Namely, the A/D converter circuit 20 of the first embodiment includes the first ring delay line 31, first latch and encoder 32, first counter 33 and latch 34 corresponding to the input voltage Vin (non-inverted analog voltage signal) input to the input line 20a, as well as the second ring delay line 41, second latch and encoder 42, second counter 43 and latch 44 corresponding to the inverted input voltage −Vin inverted by the inverting amplifier 50, separately from each other. According to the A/D converter circuit 120 of the second embodiment, on the other hand, the input voltage Vin and the inverted input voltage −Vin are selectively input to the same first ring delay line 31, first latch and encoder 32, first counter 33 and latch 34 to find the first digital data and the second digital data which are output to the digital arithmetic circuit 60. As compared to the A/D converter circuit 20 of the first embodiment, therefore, the A/D converter circuit 120 of the second embodiment suppresses a decrease in the effect for canceling the non-linearity caused by dispersion in the delay characteristics of the first ring delay line 31 and the second ring delay line 41, and, further, makes it possible to decrease the circuit scale. Therefore, the A/D converter circuit 120 makes it possible to further improve the linearity of the A/D conversion output without requiring a complex operation.

Figure 6:
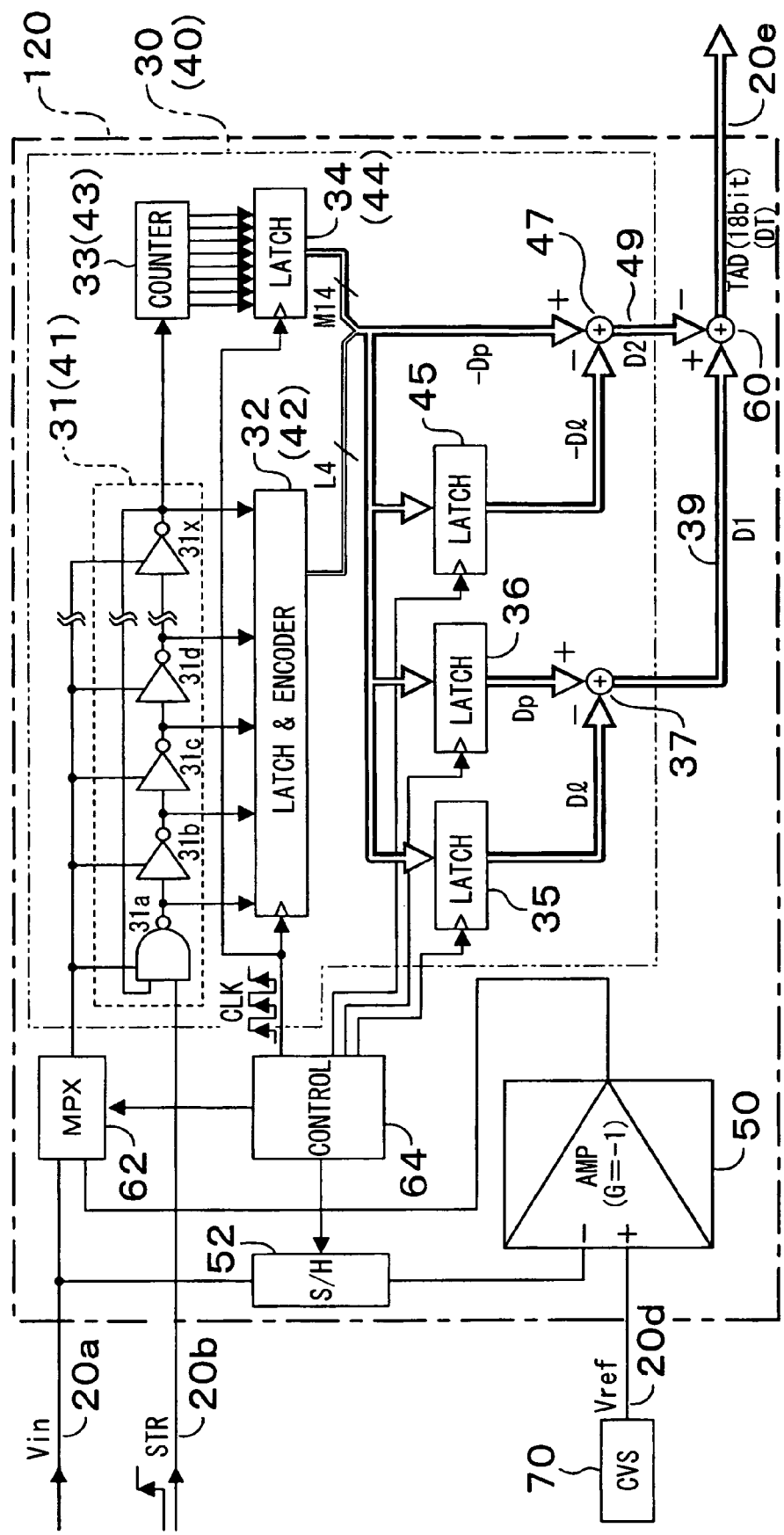
FIG. 6 is a circuit diagram showing another configuration of the A/D converter circuit according to the second embodiment.

The position where the sampling and holding circuit 52 is provided is not limited to the output side of the inverting amplifier 50 but may be, for example, on the input side of the inverting amplifier 50, i.e., between the input line 20a and the inverting amplifier 50 like the sampling and holding circuit 52 in the A/D converter circuit 120 shown in FIG. 6. In this case, the output of the inverting amplifier 50 is directly connected to the multiplexer 62. The sampling and holding circuit 52 operates as another voltage signal-holding means.

Figure 7:
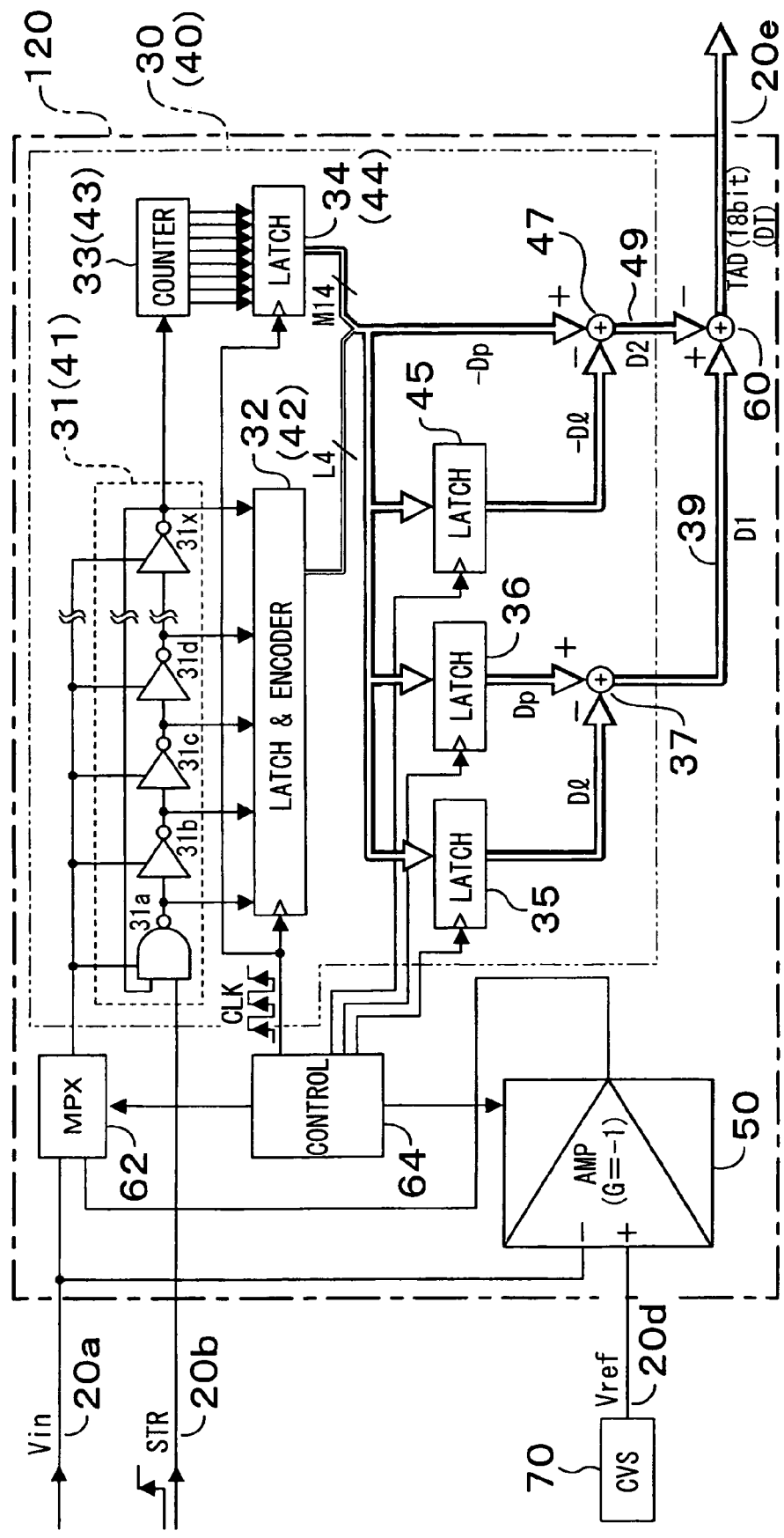
FIG. 7 is a circuit diagram showing a further configuration of the A/D converter circuit according to the second embodiment.

Instead of providing the sampling and holding circuit 52, further, the inverting amplifier 50 itself may be provided with a function for holding the input voltage Vin of before being inverted or a function for holding the inverted input voltage −Vin after inverted like, for example, the A/D converter circuit 120 shown in FIG. 7.

Third Embodiment

Figure 8:
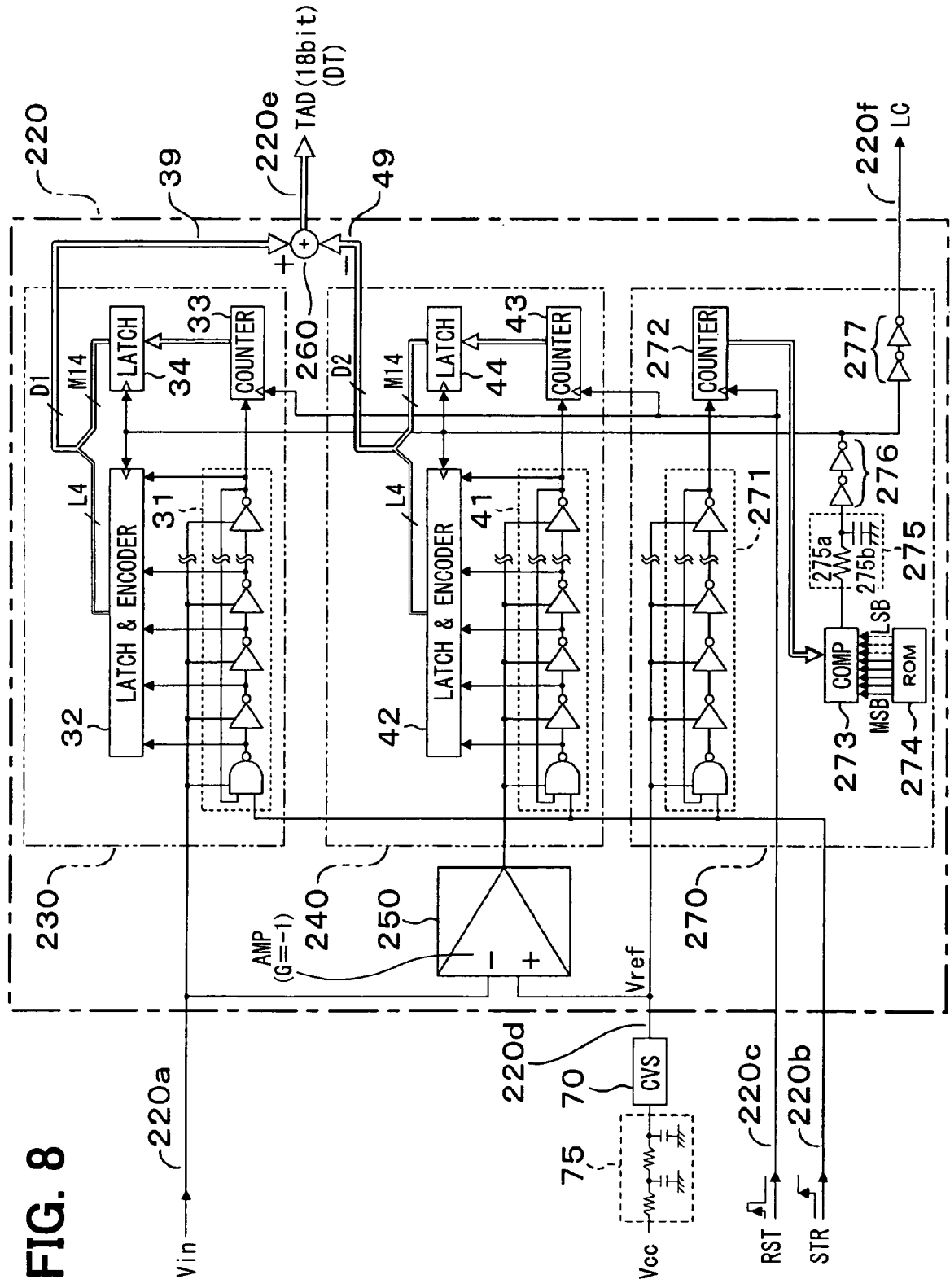
FIG. 8 is a circuit diagram showing an A/D converter circuit according to a third embodiment of the invention.

According to a third embodiment shown in FIG. 8, an A/D converter circuit 220 is different from the first embodiment with respect to suppressing the variation in the digital data caused by a change in the ambient temperature.

In the A/D converter circuits 20 and 120 of the first and second embodiments described above, the first ring delay line 31 and the second ring delay line 41 are assumed to be configured by semiconductors such as MOS transistors. Therefore, the inverting operation time (delay time) varies depending upon the temperature due to their characteristics. Therefore, the output data value converted into the digital data based on the input voltage Vin input, as a power supply voltage, to the first ring delay line 31, could vary even depending upon a change in the ambient temperature. Therefore, the A/D converter circuit 220 of this embodiment improves the above point. Here, the constituent portions substantially the same as those of the A/D converter circuit 20 of the first embodiment are denoted by the same reference numerals.

Referring to FIG. 8, the A/D converter circuit 220 is configured by a first converter unit 230, a second converter unit 240, an inverting amplifier 250, a digital arithmetic circuit 260 and a timing generator unit 270. The first converter unit 230 is configured generally in the same manner as the first converter unit 30 in the A/D converter circuit 20 of the first embodiment except that no latch 35 is provided and that a latch signal is not input from an external unit to the first latch and encoder 32 and to the latch 34 but is input thereto from the timing generator unit 270. The latch signal input to the first ring delay line 31 and to the latch 34 is output from the timing generator unit 270 at a predetermined time point.

Like the first converter unit 230, the second converter unit 240, too, is configured generally in the same manner as the second converter unit 40 in the A/D converter circuit 20 of the first embodiment. However, no latch 45 is provided and a latch signal is not input from an external unit to the second latch and encoder 42 and to the latch 44 but is input thereto from the timing generator unit 270. The latch signal input to the second ring delay line 41 and to the latch 44 is output from the timing generator unit 270 at a predetermined time point.

The inverting amplifier 250, too, is configured in the same manner as the inverting amplifier 50 in the A/D converter circuit 20 of the first embodiment, and its output is fed as the power supply voltage to the second ring delay line 41 in the second converter unit 240. Further, the digital arithmetic circuit 260, too, is configured in the same manner as the digital arithmetic circuit 60 in the A/D converter circuit 20 of the first embodiment, and operates to digitally subtract the second digital data input from the second conversion output line 49 from the first digital data of the first conversion output line 39, and outputs the subtracted result to the output line 220e. The inverting amplifier 250 operates as an inverting means and the digital arithmetic circuit 260 operates as an operation means.

The timing generator unit 270 is configured by a third ring delay line 271, a third counter 272, a digital comparator 273, a ROM 274, a low-pass filter (LPF) 275, and output buffers 276 and 277, and generates a latch signal at a predetermined time point so as to be output (notified) to the first converter unit 230 and the second converter unit 240.

The third ring delay line 271 uses, as the power supply voltage, the reference voltage Vref (predetermined reference voltage) input from the reference voltage line 220d, is configured by a NAND circuit 271a and INV circuits 271b, 271c, 271d to 271x of which the inverting operation time for inverting and outputting the input signal varies depending upon the power supply voltage in the same number and connection as the NAND circuit 31a and INV circuits 31b, 31c, 31d to 31x constituting the first ring delay line 31, the NAND circuit 271a starting the operation simultaneously with the start of operation of the NAND circuit 31a in the first ring delay line 31. The third ring delay line 271 operates as a third pulse circulating circuit.

That is, the NAND circuit 271a and INV circuits 271b, 271c, 271d to 271x constituting the third ring delay line 271 are connected like a ring in series, so that the input pulse signal is inverted for its logical value (Hi→Lo, Lo→Hi) and is then output to the next INV circuit. Further, the output terminal of the last INV circuit 271x is cyclically connected to the one input terminal of the first NAND circuit 271a and is, further, serially connected to the input terminal of the third counter 272 so as to input the signal to the third counter 272, too. A start signal line 220b, on the other hand, is connected to the other input terminal of the NAND circuit 271a to which no signal is cyclically input. This enables the inverting operation of the NAND circuit 271a when the logic level of a start signal STR input from the start signal line 220b is in the Hi state and prohibits the inverting operation of the NAND circuit 271a when the logic level of the start signal STR is in the Lo state.

The power supply voltage for driving the NAND circuit 271a and INV circuits 271b, etc. is fed from the reference voltage line that is connected to a stabilized constant-voltage source to output the reference voltage Vref. As shown, for example, in FIG. 8, the above constant-voltage source 70 is connected to the reference voltage line 220d. Therefore, the voltage the same as the reference voltage Vref fed to the inverting amplifier 250 is fed as a power supply voltage for driving the NAND circuit 271a and INV circuits 271b, etc.

The constant-voltage source 70 is configured by, for example, a band-gap type constant-voltage circuit (a band-gap voltage is used as a reference voltage) which drops a power supply voltage Vcc of a nominal voltage of +5 V input from an external unit down to a stable reference voltage Vref (DC voltage) of +3.5 V and outputs it. Thus, the reference voltage Vref which does not almost vary depending upon the temperature is produced even if the ambient temperature of the A/D converter circuit 20 varies.

Figure 9A:
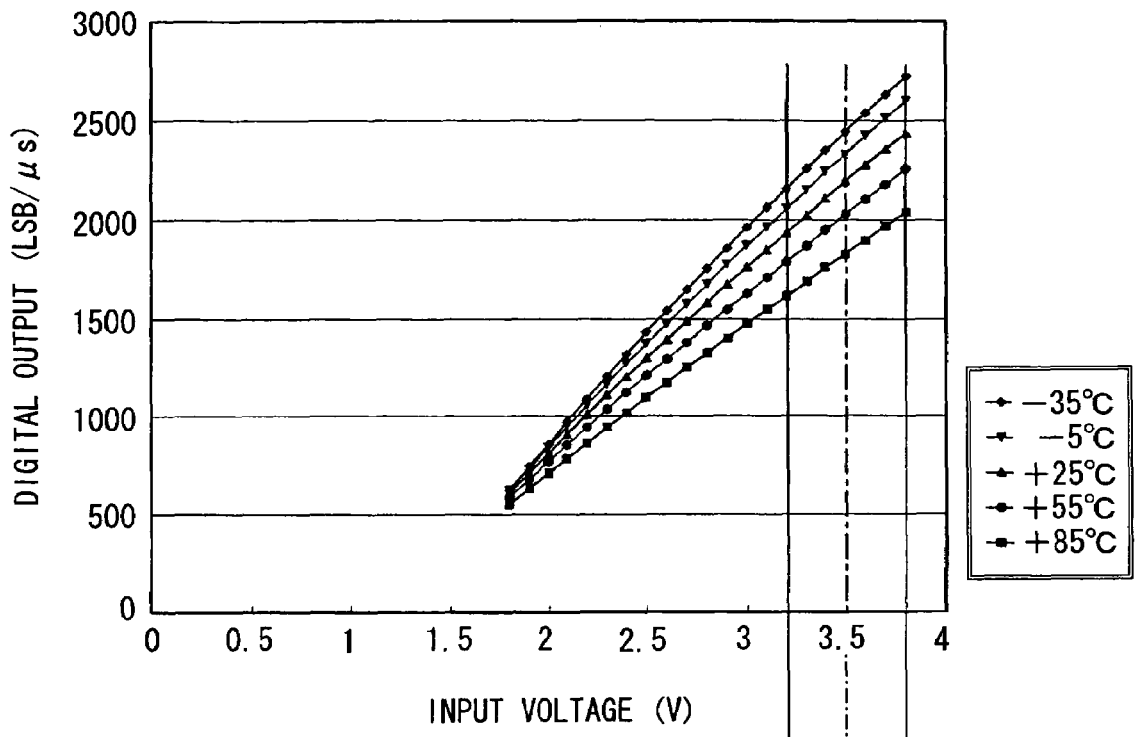
FIG. 9A and FIG. 9B are graphs showing changes in a TAD output value (converted value) relative to a voltage input to the A/D converter circuit depending upon the temperature, and variation ratios (converted value ratios) of the temperature characteristics shown in FIG. 9A with +25° C. as a reference, respectively.
Figure 9B:
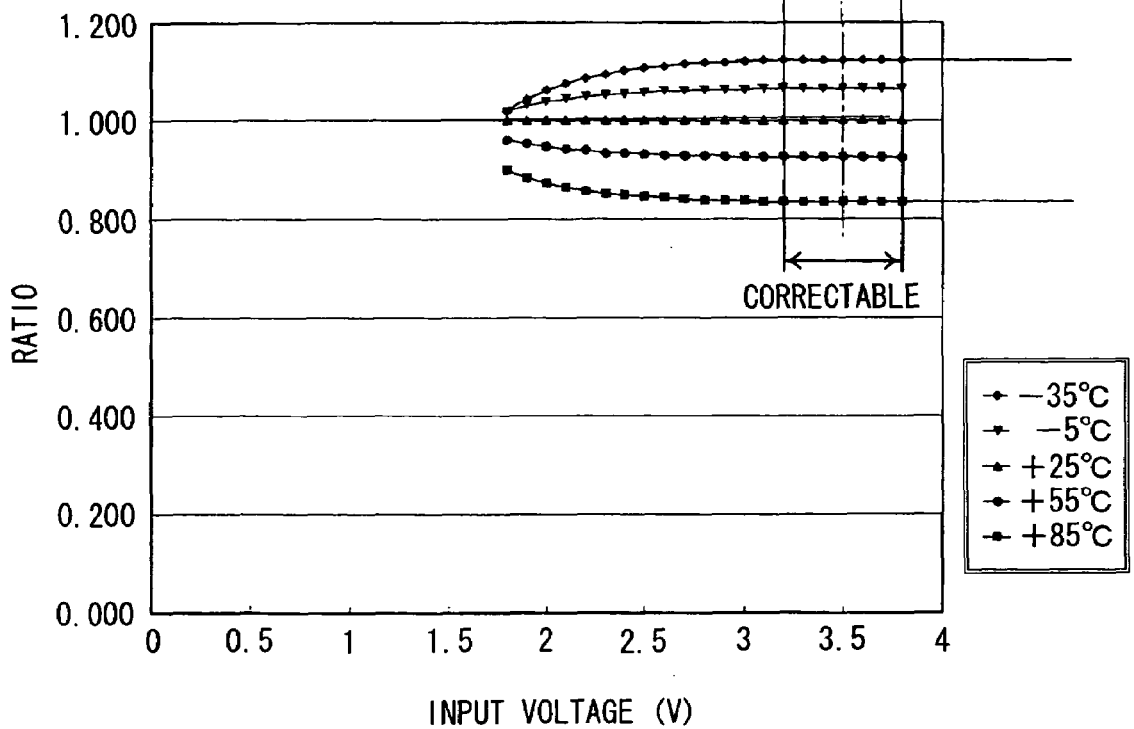

FIG. 9A is a diagram of temperature characteristics showing a relationship between the power supply voltage of the ring delay line fabricated by a semiconductor process and the digital data DT, and FIG. 9B shows the relation of FIG. 9A in a ratio with +25° C. as a reference. Here, the reference voltage Vref is set at 3.5 V on which the value of digital data DT varies at the same ratio in a range of 3.5±0.3 V of FIG. 9B even if the ambient temperature of the A/D converter circuit 20 varies over −35° C. to +85° C.

Further, between the external power source (DC voltage source) that outputs the power supply voltage Vcc and the constant-voltage source 70, there is interposed a noise-removing filter 75 for suppressing variation in the power supply voltage Vcc, i.e., a low-pass filter circuit comprising resistors 75a, 75c and capacitors 75b, 75d. This suppresses variation in the power supply voltage Vcc fed to the constant-voltage source 70. Therefore, the constant-voltage source 70 generates more stable reference voltage Vref.

The constant-voltage source 70 for feeding the reference voltage Vref to the A/D converter circuit 20 of the first embodiment and the constant-voltage source 70 for feeding the reference voltage Vref to the A/D converter circuit 120 of the second embodiment, too, may be provided with the above noise-removing filter 75 on the input side thereof to suppress variation in the power supply voltage Vcc that is fed to the constant-voltage source 70. This makes it possible to generate a further stabilized reference voltage Vref.

Figure 10:
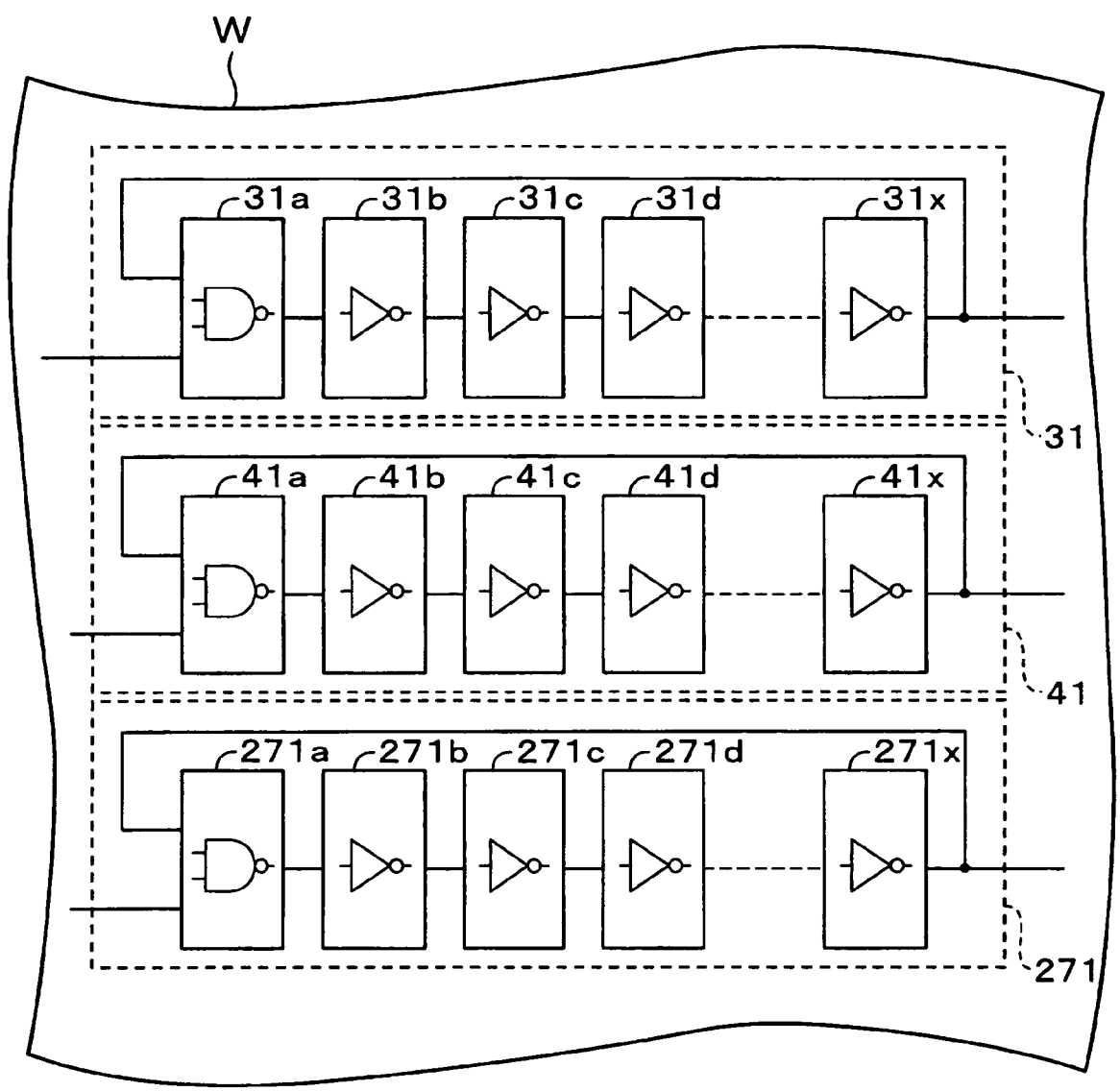
FIG. 10 is a diagram showing a first ring delay line, a second ring delay line and a third ring delay line shown in FIG. 8 on a semiconductor substrate.

Further, the third ring delay line 271 is configured so as to be thermally coupled to the first ring delay line 31 and to the second ring delay line 41. For example, as shown in FIG. 10, the first ring delay line 31, the second ring delay line 41 and the third ring delay line 271 are arranged adjacent and in parallel on the same semiconductor substrate W. It is therefore made possible to decrease the characteristic-dispersing factors caused by the semiconductor processing such as photo etching among the characteristic-dispersing factors of the transistors constituting the NAND circuit 31a and INV circuits 31b, 31c, 31d to 31x in the first ring delay line 31 and of the transistors constituting the NAND circuit 41a and INV circuits 41b, 41c, 41d to 41x in the second ring delay line 41.

Therefore, the delay characteristics due to the NAND circuit 31a and INV circuits 31b, etc. in the first ring delay line 31 or due to the NAND circuit 41a and INV circuits 41b, etc. in the second ring delay line 41 can be brought nearly in agreement with the delay characteristics due to the NAND circuit 271a and INV circuits 271b, etc. in the third ring delay line 271, contributing to improving the pair characteristics. Upon adjoining them together, the temperature conditions due to the generation of heat can be uniformed for the circuits to effectively cancel the temperature characteristics.

The third counter 272 has a function for counting the number of times of circulation of the pulse signal circulating in the third ring delay line 271 and for outputting the counted value, and its input terminal is connected to the output terminal of the INV circuit 271x of the third ring delay line 271 and its output terminal is connected to the input terminal of the digital comparator 273. Further, a reset signal line 220c is connected to a reset terminal since the counted value must be initialized by a reset signal RST input from an external unit.

Therefore, the counted value of the third counter 272 is reset by the rising edge (or falling edge) of the reset signal RST input from the reset signal line 220c, the counter starts counting the number of times of circulation of the pulse signal circulating in the third ring delay line 271, and the number of times of circulation counted from moment to moment is output as a counted value to the digital comparator 273.

The digital comparator 273 has a function which, when the counted value output from the third counter 272 reaches the predetermined value (e.g., 255 of decimal notation) read out from the ROM 274, outputs a latch signal as a predetermined time point to the first latch and encoder 32 and latch 34 of the first converter unit 230 and to the second latch and encoder 42 and latch 44 of the second converter unit 240, and operates as a time point notifying means. In this embodiment, the latch signal is output to the first latch and encoder 32 through an LPF 275 and an output buffer 276 that will be described below. However, the latch signal may be directly output to the latch and encoder 32. The ROM 274 stores the predetermined value in advance.

The LPF 275 is configured by a resistor 275a and a capacitor 275b, and permits the passage of frequency components lower than a predetermined cut-off frequency but blocks the passage of frequency components higher than the predetermined frequency. In the third embodiment, the cut-off frequency is set to, for example, the rising frequencies of glitch noise (e.g., of the order of about several tens of MHz to about hundreds of MHz) so as to remove the glitch noise.

The output buffers 276 and 277 are each configured by connecting a set of two INV circuits in series, and operate to adjust the output time point and to maintain driving capability for the succeeding stages. The output buffer 277 is provided for outputting a latch completion signal LC to a latch signal completion line 220f for notifying the completion of the latch signal to the external unit.

The A/D converter circuit 220 according to the third embodiment uses the input voltage Vin to be A/D-converted as the power supply voltage for the NAND circuit 31a and the INV circuits 31b, 31c, 31d to 31x in the first ring delay line 31 of the first converter unit 230. Namely, the position of the pulse signal circulating in the first ring delay line 31 and the number of times of circulation differ depending upon the magnitude of the input voltage Vin. Therefore, the number of times of circulation of the pulse signal is counted by the first counter 33, and the counted value is output as the first digital data at the predetermined time point.

Further, the input voltage Vin is inverted by the inverting amplifier 250 in the increasing/decreasing direction based on the reference voltage Vref which is nearly at the center in the range of the power supply voltage where the first digital data value varies nearly constantly relative to a change in the power supply voltage. The thus inverted input voltage –Vin is used as the power supply voltage for the NAND circuit 41a and INV circuits 41b, 41c, 41d to 41x in the second ring delay line 41. Namely, the position of the pulse signal circulating in the second ring delay line 41 and the number of times of circulation differ depending upon the magnitude of the inverted input voltage –Vin. Therefore, the number of times of circulation of the pulse signal is counted by the second counter 43, and the counted value is output as the second digital data at the predetermined time point.

Namely, the second digital data has output characteristics inverted in the increasing/decreasing direction of the input voltage Vin based on the intermediate voltage relative to the first digital data. Therefore, the subtracted result produced by subtracting the second digital data from the first digital data through the digital arithmetic circuit 260 is output to the output line 220e as the binary digital data DT to thereby cancel the non-linearity of the first pulse circulating circuit by the non-linearity of the second pulse circulating circuit. It is therefore made possible to improve the linearity of the A/D-converted output without requiring a complex operation.

The reference voltage Vref is input as the power supply voltage to the third ring delay line 271 in the timing generator unit 270. Further, the third counter 272 counts the number of times of circulation of the pulse signal circulating in the third ring delay line 271 under nearly the same temperature environment as the first ring delay line 31 of the first converter unit 230 and the second ring delay line 41 of the second converter unit 240. A time point at which the counted value reaches the predetermined value is output (notified) as the latch signal at the predetermined time point to the first latch and encoder 32 and latch 34 of the first converter unit 230 and to the second latch and encoder 42 and latch 44 of the second converter unit 240. Therefore, the binary digital data DT is produced at the above time point canceling the non-linearity of the first ring delay line 31 by the non-linearity of the second ring delay line 41.

That is, the analog voltage input to the third ring delay line 271 is the reference voltage Vref output from the constant-voltage source 70 which is almost free from the temperature variation and does not vary, therefore, the predetermined time point produced based on the number of times of circulation of the third ring delay line 271 varies depending only upon the temperature characteristics of the third ring delay line 271. The first ring delay line 31 of the first converter unit 230 and the second ring delay line 41 of the second converter unit 240 vary the output characteristics thereof accompanying a change in the ambient temperature like the third ring delay line 271 of the timing generator unit 270. Therefore, the temperature characteristics of the first ring delay line 31 and of the second ring delay line 41 can be canceled by the temperature characteristics of the third ring delay line 271. On the other hand, the digital data corresponding to a difference of the analog voltage from the reference voltage Vref is produced as the binary digital data DT canceling the non-linearity of the first ring delay line 31 by the non-linearity of the second ring delay line 41. It is therefore made possible to also suppress variation in the digital data DT caused by a change in the ambient temperature and, accordingly, to further improve the precision inclusive of the linearity of the A/D-converted output without requiring a complex operation.

Though the same reference voltage Vref fed to the inverting amplifier 250 is input as the power supply voltage to the third ring delay line 271 of the timing generator unit 270, it is also allowable to feed the same or different reference voltages Vref from the separate voltage sources not being limited thereto only.

Fourth Embodiment

Figure 11:
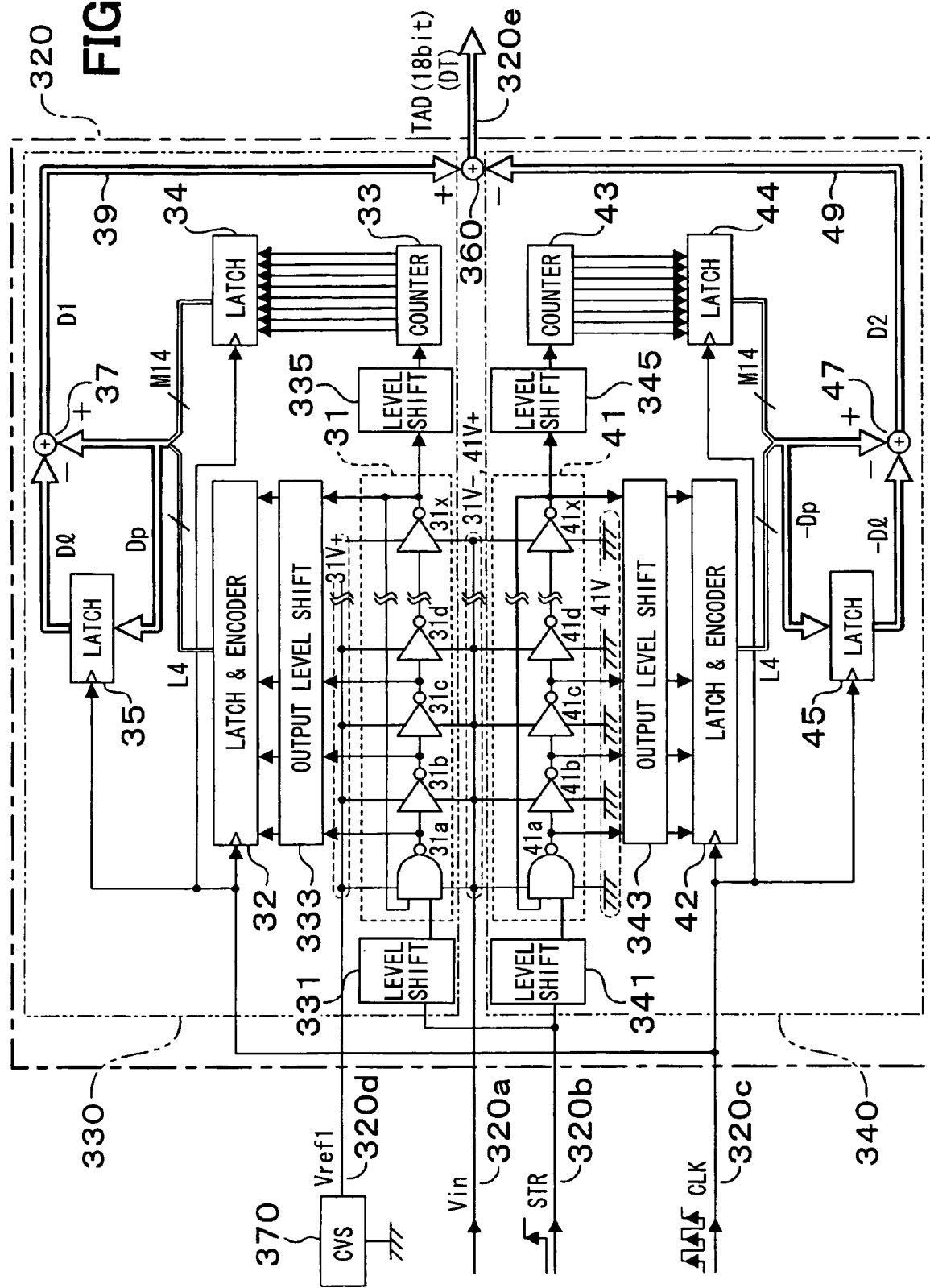
FIG. 11 is a circuit diagram showing an A/D converter circuit according to a fourth embodiment of the invention.

According to a fourth embodiment shown in FIG. 11, an A/D converter circuit 320 improves the linearity of the A/D-converted output without using the inverting amplifier 50, etc. and without executing complex operations like in the A/D converter circuits 20, 120, 220 of the first to third embodiments, in which the A/D converter circuits 20, 120, 220 inverts the input voltage Vin in the increasing/decreasing direction by using inverting amplifiers 50, 250 based on the reference voltage Vref. The constituent portions substantially the same as those of the A/D converter circuit 20 of the first embodiment are denoted by the same reference numerals.

Referring to FIG. 11, the A/D converter circuit 320 is configured by a first converter unit 330, a second converter unit 340, a digital arithmetic circuit 360 and a constant-voltage source 370. The A/D converter circuit 20 is different from the A/D converter circuit 20 of the first embodiment with respect to that an analog input voltage Vin fed to the input line 320a is not a power supply voltage fed to the NAND circuit 31a and INV circuits 31b, 31c, 31d to 31x in the first ring delay line 31 but is a reference operation voltage, that not the inverted input voltage −Vin but the analog input voltage Vin input to the input line 320a is input to the second ring delay line 41, and that an input level shifter 331 is provided.

That is, the input line 320a is connected to the first ring delay line 31 so that the analog input voltage Vin input to the input line 320a can be input to the first ring delay line 31 as a reference operation voltage 31V− of the first ring delay line 31, and the input line 320a is connected to the second ring delay line 41 so that the input voltage Vin can be input to the second ring delay line 41 as an operation power supply voltage 41V+ of the second ring delay line 41. That is, the reference operation voltage of the first ring delay line 31 and the operation power supply voltage of the second ring delay line 41 are equalized and are input to the input line 320a.

Since the first ring delay line 31 uses the reference operation voltage 31V− as the input voltage Vin as described above, the operation power supply voltage 31V+ must be set to be higher than the above voltage. In the A/D converter circuit 320, therefore, the constant-voltage source 370 is connected to the reference voltage line 320d so that a predetermined reference voltage Vref1 output from the constant-voltage source 370 can be fed as the operation power supply voltage 31V+.

The constant-voltage source 370 is configured in the same manner as the constant-voltage source 70 described in the first embodiment except that a different voltage is output. That is, the constant-voltage source 370 is a band-gap type constant-voltage circuit using a band-gap voltage as a reference voltage, and is capable of producing the reference voltage Vref1 in which temperature does not almost vary though the ambient temperature of the A/D converter circuit 20 varies. The reference voltage Vref1 is set to be twice as great as a voltage which is nearly at the center in a range in which the input voltage Vin which is an analog voltage signal varies.

For example, if the input voltage Vin varies over 2 V to 5 V, the reference voltage Vref1 is set to be 7 V (=3.5 V×2) which is twice as great as 3.5 V that is the intermediate voltage. Further, as described in the first embodiment with reference to FIG. 3, the reference voltage Vref1 is set to be twice as great as the voltage which is nearly at the center in the voltage range in which the first digital data value output from the digital arithmetic circuit 37 varies nearly constantly relative to a change in the input voltage Vin. Therefore, the reference voltage Vref1 (e.g., 7 V) is set as the operation power supply voltage 31V+ and the input voltage Vin (e.g., 3.5 V at the center) is set as the reference operation voltage 31V− for the NAND circuit 31a and INV circuits 31b, 31c, 31d to 31x constituting the first ring delay line 31.

On the other hand, since the second ring delay line 41 uses the operation power supply voltage 41V+ as the input voltage Vin, the reference operation voltage 41V− thereof must be set to be lower than the above voltage. In the A/D converter circuit 20, therefore, a predetermined voltage lower than a minimum input voltage Vin or the ground Gnd of the A/D converter circuit 20 is set to be the reference operation voltage 41V−. The ground Gnd is set to be the same as the ground Gnd of the constant-voltage source 37. Therefore, the input voltage Vin (e.g., 3.5 V at the center) is set as the operation power supply voltage 41V+ and the ground potential Vin (e.g., 0 V) is set as the reference operation voltage 41V− for the NAND circuit 41a and INV circuits 41b, 41c, 41d to 41x constituting the second ring delay line 41.

By constituting the first ring delay line 31 and the second ring delay line 41 as described above, the operation power supply voltage 31V+ for the NAND circuit 31a and INV circuits 31b, 31c, 31d to 31x in the first ring delay line 31 is fixed to the reference voltage Vref1 (e.g., 7 V), while the reference operation voltage 31V− thereof varies depending upon a change in the input voltage Vin. The operation power supply voltage 41V+ of the NAND circuit 41a and INV circuits 41b, 41c, 41d to 41x in the second ring delay line 41 varies depending upon a change in the input voltage Vin, and the reference operation voltage 41V− thereof is fixed to ground Gnd.

Therefore, an increase in the input voltage Vin is accompanied by an increase in the reference operation voltage 31V− of the NAND circuit 31a and INV circuits 31b, 31c, 31d to 31x in the first ring delay line 31 and in the operation power supply voltage 41V+ of the NAND circuit 41a and INV circuits 41b, 41c, 41d to 41x in the second ring delay line 41, resulting in a decrease in the operation voltage (differential voltage between the operation power supply voltage 31V+ and the reference operation voltage 31V−) fed to the NAND circuit 31a, etc. in the first ring delay line 31 while resulting in an increase in the operation voltage (differential voltage between the operation power supply voltage 41V+ and the reference operation voltage 41V−) fed to the NAND circuit 41a, etc. in the second ring delay line 41. Therefore, the input voltage Vin input to the input line 320a is converted into the first digital data and is output from the first conversion output line 39, and is converted into the second digital data and is output from the second conversion output line 49, having characteristics as shown in FIG. 12, respectively.

That is, while the input voltage Vin is input as the operation power supply voltage 31V+ to the first ring delay line 31, the second ring delay line 41 receives, as an operation voltage, an inverted analog voltage signal equivalent to the one produced by inverting the analog voltage signal in the increasing/decreasing direction based on nearly an intermediate voltage in a range where the input voltage Vin varies. Therefore, if the input voltage Vin varies over, for example, 2 V to 5 V, the input voltage Vin is inverted in the increasing/decreasing direction based on the intermediate voltage of 3.5 V (Vref shown in FIG. 12) and is output from the first conversion output line 39 and the second conversion output line 49. Therefore, the A/D converter circuit 20, too, makes it possible to invert the input voltage Vin in the increasing/decreasing direction like inverting the input voltage Vin in the increasing/decreasing direction based on the reference voltage Vref by using the inverter amplifier 50 in the A/D converter circuit 20 of the first embodiment described with reference to FIG. 3.

Figure 12:
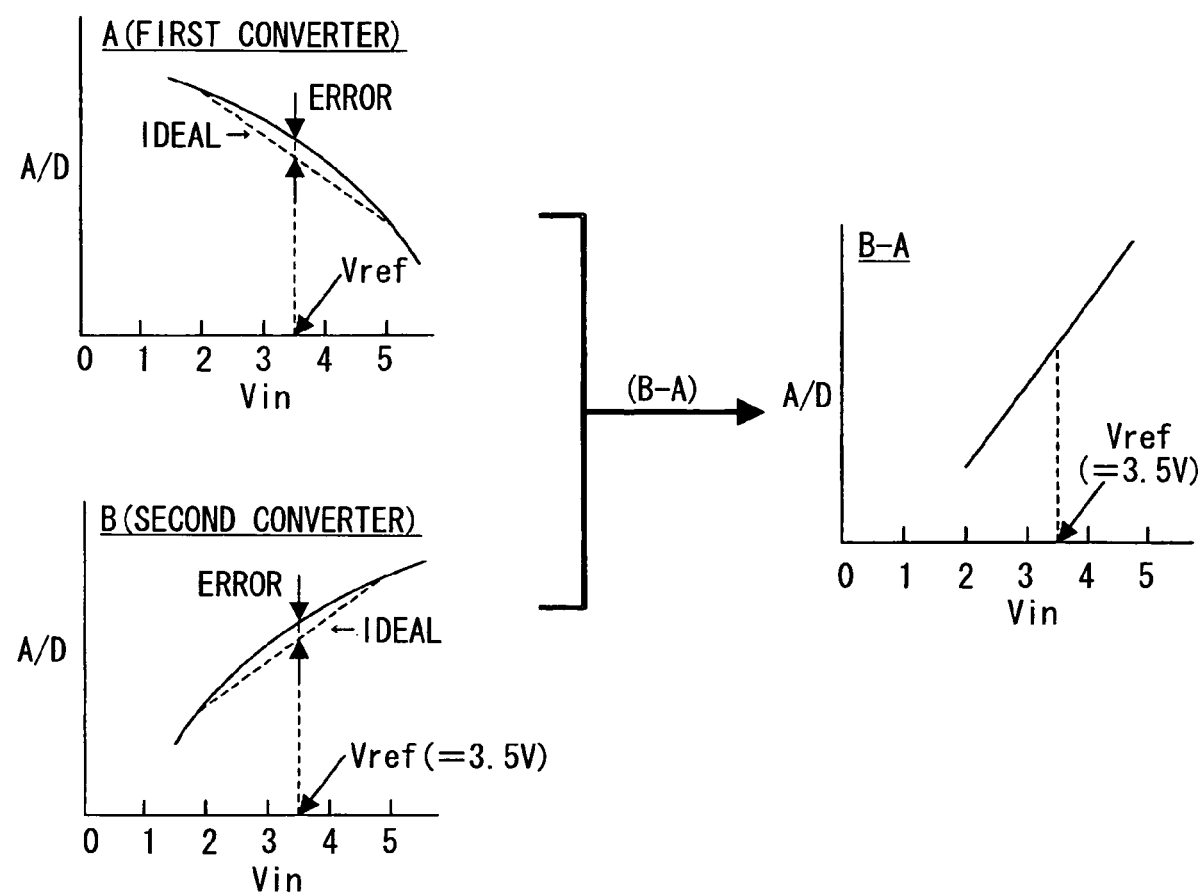
FIG. 12 is a set of graphs illustrating the concept of the operation principle of the A/D converter circuit according to the fourth embodiment.

Further, upon setting the reference voltage Vref1 output from the constant-voltage source 370 to be twice as great as nearly the intermediate voltage in the voltage range where the first digital data output from the digital arithmetic circuit 37 varies nearly constantly relative to a change in the input voltage Vin, the digital data DT produced by subtracting the second digital data from the first digital data features improved linearity as represented by "B−A" in FIG. 12 (diagram of characteristics on the right side).

According to the fourth embodiment as described above, the operation voltage of the first ring delay line 31 is shifted toward the positive (+) side and the operation voltage of the second ring delay line 41 is shifted toward the negative (−) side, respectively, with the input voltage Vin input to the input line 320a as the intermediate value. Therefore, the first ring delay line 31 and the second ring delay line 41 are not capable of processing the start signal STR of the signal level of 0 V to 5 V input from a unit outside the A/D converter circuit 20. Further, the signal output from the first ring delay line 31 or the second ring delay line 41 is not a signal of the signal level of 0 V to 5 V, and can be processed by none of the first latch and encoder 32, first counter 33, second latch and encoder 42 or second counter 43.

In the A/D converter circuit 20, therefore, an input level shifter 331 is provided on the input side of the first ring delay line 31, and output level shifters 333 and 335 are provided on the output side of the first ring delay line 31. Further, an input level shifter 341 is provided on the input side of the second ring delay line 41, and output level shifters 343 and 345 are provided on the output side of the second ring delay line 41.

Figure 13:
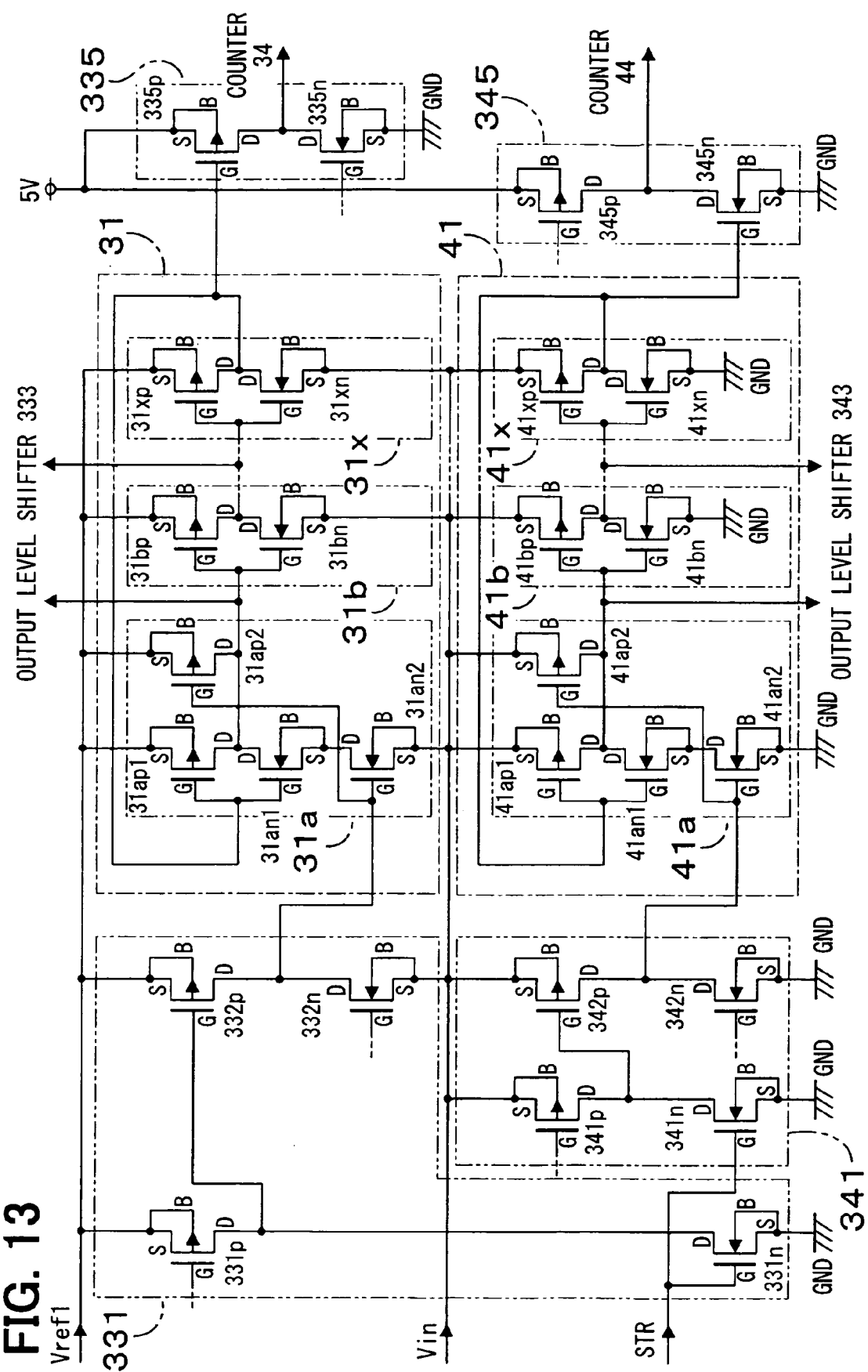
FIG. 13 is a circuit diagram illustrating the first ring delay line and the second ring delay line shown in FIG. 11.

The input level shifter 331 converts the level of the start signal STR (Lo: 0 V, Hi: 5 V) input from the start signal line 320b into a level that can be processed by the NAND circuit 31a of the first ring delay line 31. As shown in FIG. 13, the input level shifter 331 is configured by, for example, a P-MOS transistor 331p and an N-MOS transistor 331n connected in series between the reference voltage Vref1 and ground GND, and a P-MOS transistor 332p and an N-MOS transistor 332n connected in series between the reference voltage Vref1 and the input voltage Vin.

Among them, the P-MOS transistor 331p and N-MOS transistor 332n operate as a constant-current source and, therefore, function as an active load. The P-MOS transistor 331p feeds a constant current to the N-MOS transistor 331n. Therefore, the N-MOS transistor 331n outputs an inverted signal from the drain D thereof as an output voltage corresponding to the start signal STR input to the gate G thereof. Further, the N-MOS transistor 332n feeds a constant current to the P-MOS transistor 332p. Therefore, the P-MOS transistor 332p receives the signal output from the N-MOS transistor 331n through the gate G thereof, and outputs an inverted signal through the drain D thereof. Therefore, a start signal of the Hi logic (signal level, 5 V) input from the start signal line 320b is converted into 7 V, and a signal of the Lo logic (signal level, 0 V) is converted into 3.5 V.

The input level shifter 341, too, converts the level of the start signal STR (Lo: 0 V, Hi: 5 V) input from the start signal line 320b into a level that can be processed by the NAND circuit 41a of the second ring delay line 41. As shown in FIG. 13, for example, a P-MOS transistor 341p and an N-MOS transistor 341n are connected in series between the input voltage Vin and ground GND, and a P-MOS transistor 342p and an N-MOS transistor 342n are connected in series between the input voltage Vin and ground GND. The P-MOS transistor 341p and N-MOS transistor 342n constitute a constant-current source which operates as an active load.

The P-MOS transistor 341p feeds a constant current to the N-MOS transistor 341n. Therefore, the N-MOS transistor 341n outputs an inverted signal from the drain D thereof as an output voltage corresponding to the start signal STR input to the gate G thereof. Further, the N-MOS transistor 432n feeds a constant current to the P-MOS transistor 342p. Therefore, the P-MOS transistor 342p receives the signal output from the N-MOS transistor 341n through the gate G thereof, and outputs an inverted signal through the drain D thereof. Therefore, the start signal of the Hi logic (signal level, 5 V) input from the start signal line 320b is converted into 3.5 V, and the signal of the Lo logic (signal level, 0 V) is converted into 0 V.

On the other hand, the output level shifters 333 and 335 convert the level of the pulse signal (Lo: 3.5 V, Hi: 7 V) output from the first ring delay line 31 into the level that can be processed by the first counter 33 and the first latch and encoder 32. As shown in FIG. 13, the output level shifter 335 is configured by, for example, a P-MOS transistor 335p and an N-MOS transistor 335n connected in series between the power supply voltage 5 V and ground GND, the gate G of the P-MOS transistor 335p serving as an input, and the drains D of the two transistors 335p and 335n serving as an output. The N-MOS transistor 335n operates as a constant-current source and operates as an active load for the P-MOS transistor 335p. Therefore, a pulse signal of the Hi logic (signal level, 7 V) input from the first ring delay line 31 is converted into 5 V, and the signal of the Lo logic (signal level, 3.5 V) is converted into 0 V.

Similarly, further, the output level shifters 343 and 345 convert the level of the pulse signal (Lo: 0 V, Hi: 3.5 V) output from the second ring delay line 41 into the level that can be processed by the second counter 43 and the second latch and encoder 42. As shown in FIG. 13, for example, the output level shifter 345 is configured by a P-MOS transistor 345p and an N-MOS transistor 345n connected in series between the power supply voltage 5 V and ground GND, the gate G of the N-MOS transistor 345n serving an input, and the drains D of the two transistors 345p and 345n serving as an output. The P-MOS transistor 345p operates as a constant-current source and operates as an active load for the N-MOS transistor 345n. Therefore, the pulse signal of the Hi logic (signal level, 3.5 V) input from the second ring delay line 41 is converted into 5 V, and the signal of the Lo logic (signal level, 0 V) is output as 0 V.

FIG. 13 is a circuit diagram of the first ring delay line 31 and the second ring delay line 41, which will now be briefly described below. As shown in FIG. 13, the NAND circuit 31a is a general NAND circuit comprising P-MOS transistors 31ap1, 31ap2 and N-MOS transistors 31an1, 31an2, between the reference voltage Vref1 and the input voltage Vin. Similarly, further, the NAND circuit 41a is a general NAND circuit comprising P-MOS transistors 41ap1, 41ap2 and N-MOS transistors 41an1, 41an2, between the input voltage Vin and ground GND.

Further, the INV circuit 31b is a general inverter logic circuit comprising P-MOS transistors 31bp and an N-MOS transistor 31bn between the reference voltage Vref1 and the input voltage Vin. The INV circuits 31c, 31d to 31x, too, are configured similarly to the INV circuit 31b. Further, like the INV circuit 31b, the INV circuit 41b, too, is a general inverter logic circuit comprising a P-MOS transistors 41bp and an N-MOS transistor 41bn between the input voltage Vin and ground GND. INV circuits 41c, 41d to 41x, too, are configured similarly to the INV circuit 41b.

According to the fourth embodiment as will be learned from the symbols of MOS transistors in the first ring delay line 31 and the second ring delay line 41 shown in FIG. 13, when the P-MOS transistors and the N-MOS transistors are formed on the same semiconductor substrate, their back gates must be electrically isolated from the substrate potential of the semiconductor substrate.

That is, referring to the first ring delay line 31, the layer of the P-MOS transistor 31ap1 that constitutes the NAND circuit 31a is so formed that the back gate B thereof is connected to the reference voltage Vref1 being electrically isolated from the substrate potential of the semiconductor substrate W, and the layer of the N-MOS transistor 31an1 is so formed that the back gate B thereof is connected to the input voltage Vin being electrically isolated from the substrate potential of the semiconductor substrate W. Back gates are formed in the P-MOS transistor 31ap2 and the N-MOS transistor 31an2, similarly.

Figure 14A:
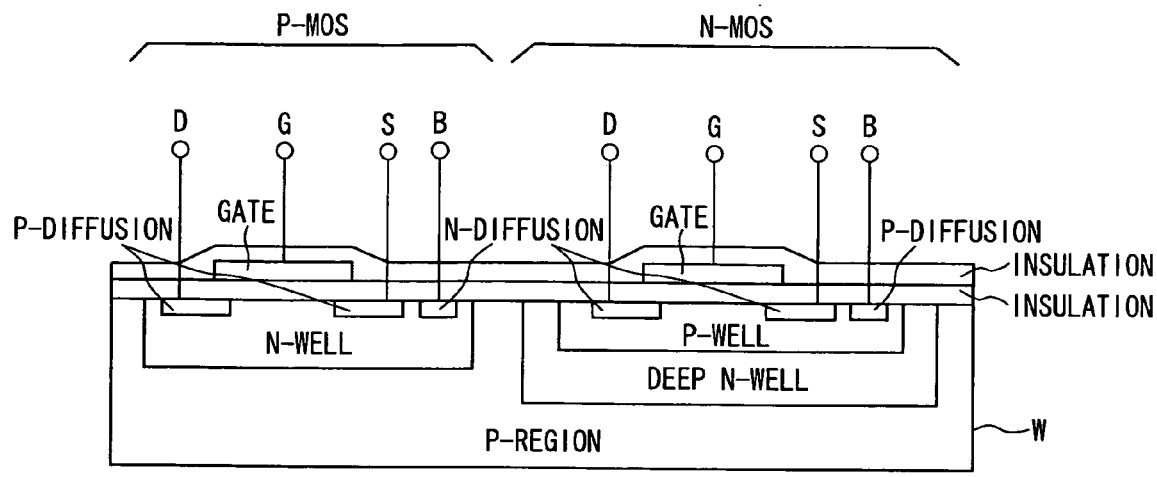
FIG. 14A and FIG. 14B are sectional views showing MOS transistors constituting the first ring delay line and the second ring delay line shown in FIG. 13, respectively.

Specifically, as shown in FIG. 14A, when the semiconductor substrate W is of the P-type, the back gate of the N-MOS transistor assumes the substrate potential (potential of the P-region) at all times, i.e., assumes, usually, ground potential GND. Here, however, the N-MOS transistor is formed in a double-well structure in which a deep N-well surrounds a P-well that surrounds the layer forming the N-MOS transistor. Therefore, the N-MOS transistor is electrically isolated, and the back gate of the N-MOS transistor is electrically isolated from the semiconductor substrate W. The layer forming the P-MOS transistor is surrounded by an N-well. When the semiconductor substrate W is of the P-type, therefore, the back gate of the N-MOS transistor can be electrically isolated from the semiconductor substrate W without employing the double well structure.

Figure 14B:
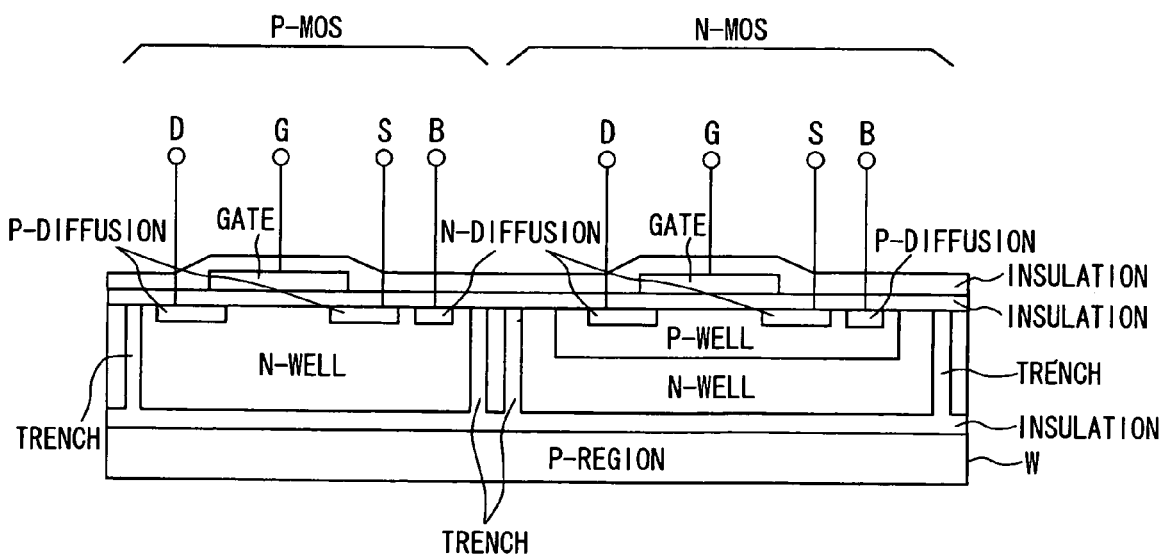

Referring to FIG. 14B, further, when the semiconductor substrate W is based on the SOI (silicon-on-insulator) structure, the element may be isolated by a trench structure surrounding the P-well that surrounds the layer of the N-MOS transistor by utilizing a silicon oxide ($SiO_2$) of SOI structure. In this case, too, the P-MOS transistor has an N-well surrounding the layer that is forming the P-MOS transistor. When the semiconductor substrate W is of the P-type, therefore, the back gate of the N-MOS transistor can be electrically isolated from the semiconductor substrate W without employing the element-isolation structure based on the trench structure.

As described above, in the A/D converter circuit 320 of the fourth embodiment, the first ring delay line 31 uses the reference operation voltage 31V− as the input voltage Vin and uses the operation power supply voltage 31V+ as the reference voltage Vref1 twice as great as nearly an intermediate voltage in a range in which the input voltage Vin varies. The second ring delay line 41, on the other hand, uses the reference operation voltage 41V− as ground potential GND which is lower than a minimum value of the input voltage Vin and uses the operation power supply voltage 41V+ as the input voltage Vin. Therefore, an increase in the input voltage Vin results in a decrease in the operation voltage of the NAND circuit 31a and INV circuits 31b, 31c, 31d to 31x in the first ring delay line 31 and in an increase in the operation voltage of the NAND circuit 41a and INV circuits 41b, 41c, 41d to 41x in the second ring delay line 41. Conversely, a decrease in the input voltage Vin results in an increase in the operation voltage of the NAND circuit 31a and INV circuits 31b, etc. in the first ring delay line 31 and in a decrease in the operation voltage of the NAND circuit 41a and INV circuits 41b, etc. in the second ring delay line 41.

Namely, while the first ring delay line 31 receives the input voltage Vin as the operation voltage, the second ring delay line 41 receives, as the operation voltage, an inverted analog voltage signal equivalent to the one formed by inverting the input voltage Vin in the increasing/decreasing direction based on nearly an intermediate voltage in the range in which the input voltage Vin varies. Therefore, a subtracted result produced by subtracting the second digital data related to the number of times of circulation of the pulse signal circulating in the second ring delay line 41 from the first digital data related to the number of times of circulation of the pulse signal circulating in the first ring delay line 31, is output as a binary digital data to the output line 320e, to thereby cancel the non-linearity of the first ring delay line 31 by the non-linearity of the second ring delay line 41. Therefore, in addition to improving the linearity of the A/D-converted output without requiring complex operation, no inverting amplifier 50 or 250 is required that are used in the A/D converter circuits 20, 120, 220 of the first to third embodiments, making it possible to suppress the circuit scale correspondingly.

Fifth Embodiment

Figure 15:
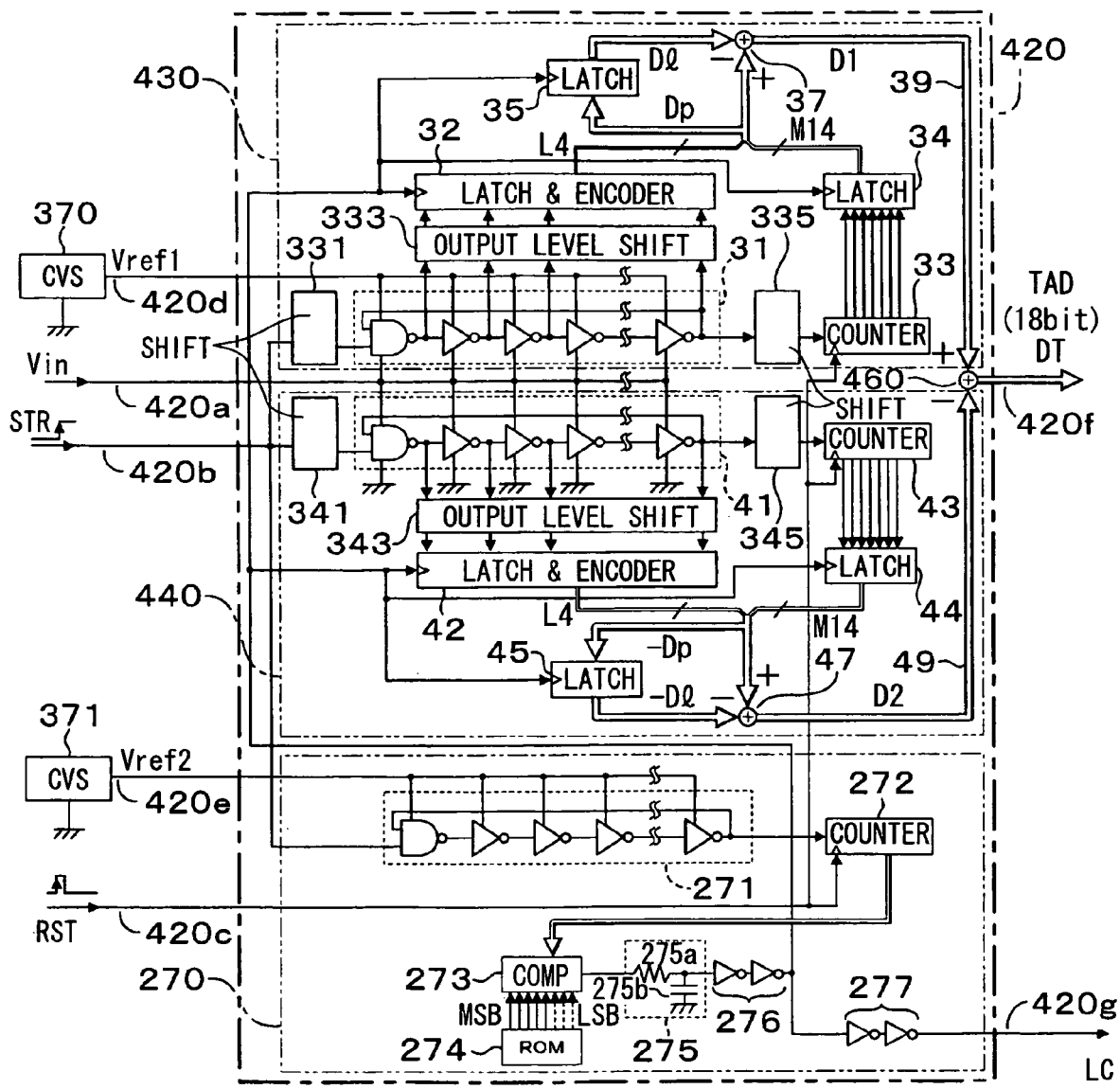
FIG. 15 is a circuit diagram showing an A/D converter circuit according to a fifth embodiment of the invention.

According to a fifth embodiment shown in FIG. 15, an A/D converter circuit 420 is different from the A/D converter circuit 320 of the fourth embodiment with respect to suppressing the variation in the digital data caused by a change in the ambient temperature.

In the A/D converter circuit 320 of the fourth embodiment described above, the first ring delay line 31 and the second ring delay line 41 are configured by semiconductors such as MOS transistors and, therefore, the inverting operation time (delay time) varies depending upon the temperature due to their characteristics. In the A/D converter circuit 420 of the fifth embodiment, therefore, a timing generator unit 270 is added to improve the defect like in the A/D converter circuit 20 of the third embodiment. Here, the constituent portions substantially the same as those of the A/D converter circuit 320 of the third embodiment and as those of the A/D converter circuit 20 of the fourth embodiment are denoted by the same reference numerals.

Referring to FIG. 15, the A/D converter circuit 420 is configured by a first converter unit 430, a second converter unit 440, a digital arithmetic circuit 460 and the timing generator unit 270. The first converter unit 430 is configured generally in the same manner as the first converter unit 330 in the A/D converter circuit 320 of the fourth embodiment except that a latch signal is not input from an external unit to the first latch and encoder 32 and to the latches 34, 35 but is input thereto from the timing generator unit 270. The latch signal input to the first ring delay line 31 and to the latches 34, 35 is output from the timing generator unit 270 at a predetermined time point.

Like the first converter unit 430, the second converter unit 440, too, is configured generally in the same manner as the second converter unit 40 in the A/D converter circuit 320 except that a latch signal is not input from an external unit to the second latch and encoder 42 and to the latches 44, 45 but is input thereto from the timing generator unit 270. The latch signal input to the second ring delay line 41 and to the latches 44, 45 is output from the timing generator unit 270 at a predetermined time point.

The digital arithmetic circuit 460, too, is configured in the same manner as the digital arithmetic circuit 360 constituting the A/D converter circuit 320, digitally subtracts a second digital data of the second conversion output line 49 from the first digital data of the first conversion output line 39, and outputs the subtracted result to the output line 420f. The digital arithmetic circuit 460 operates as an operation means.

The timing generator unit 270 is configured by a third ring delay line 271, a third counter 272, a digital comparator 273, a ROM 274, an LPF 275, and output buffers 276 and 277, and generates a latch signal at a predetermined time point so as to be output (notified) to the first converter unit 230 and the second converter unit 240.

The third ring delay line 271 uses, as a power supply voltage, a reference voltage Vref (predetermined reference voltage) input from the reference voltage line 220d, is configured by a NAND circuit 271a and INV circuits 271b, 271c, 271*d* to 271*x* of which the inverting operation time for inverting and outputting the input signal varies depending upon the power supply voltage in the same number and connection as the NAND circuit 31*a* and INV circuits 31*b*, 31*c*, 31*d* to 31*x* constituting the first ring delay line 31, the NAND circuit 271*a* starting the operation simultaneously with the start of operation of the NAND circuit 31*a* in the first ring delay line 31. The third ring delay line 271 operates as a third pulse circulating circuit.

The power supply voltage for driving the NAND circuit 271*a* and INV circuits 271*b*, etc. is fed from the reference voltage line that is connected to a stabilized constant-voltage source to output the reference voltage Vref2. As shown, for example, in FIG. 15, a constant-voltage source 371 configured in the same manner as the constant-voltage source 70 described in the first embodiment is connected to the reference voltage line 420*d*, and the reference voltage Vref2 which is the same as the reference voltage Vref is fed as the power supply voltage to drive the NAND circuit 271*a* and INV circuits 271*b*, etc.

The constant-voltage source 371 is configured by, for example, a band-gap type constant-voltage circuit which drops a power supply voltage Vcc of a nominal voltage of +5 V input from an external unit down to a stable reference voltage Vref2 (DC voltage) of +3.5 V and outputs it. Thus, the reference voltage Vref2 which does not almost vary depending upon the temperature is produced even if the ambient temperature of the A/D converter circuit 20 varies.

Further, the third ring delay line 271 is configured so as to be thermally coupled to the first ring delay line 31 and to the second ring delay line 41. For example, as shown in FIG. 10, the first ring delay line 31, the second ring delay line 41 and the third ring delay line 271 are arranged adjacent and in parallel on the same semiconductor substrate W. It is therefore made possible to decrease the characteristic-dispersing factors caused by the semiconductor processing such as photo etching among the characteristic-dispersing factors of the transistors constituting the NAND circuit 31*a* and INV circuits 31*b*, 31*c*, 31*d* to 31*x* in the first ring delay line 31 and of the transistors constituting the NAND circuit 41*a* and INV circuits 41*b*, 41*c*, 41*d* to 41*x* in the second ring delay line 41.

Therefore, the delay characteristics due to the NAND circuit 31*a* and INV circuits 31*b*, etc. in the first ring delay line 31 or due to the NAND circuit 41*a* and INV circuits 41*b*, etc. in the second ring delay line 41 can be brought nearly in agreement with the delay characteristics due to the NAND circuit 271*a* and INV circuits 271*b*, etc. in the third ring delay line 271, contributing to improving the pair characteristics. Upon adjoining them together, further, the temperature conditions due to the generation of heat can be uniformed for the circuits to effectively cancel the temperature characteristics.

As described above, in the A/D converter circuit 420 of the fifth embodiment, the first ring delay line 31 uses the reference operation voltage 31V− as the input voltage Vin and uses the operation power supply voltage 31V+ as the reference voltage Vref1 twice as great as nearly an intermediate voltage in a range in which the input voltage Vin varies. The second ring delay line 41, on the other hand, uses the reference operation voltage 41V− as ground potential Gnd which is lower than a minimum value of the input voltage Vin and uses the operation power supply voltage 41V+ as the input voltage Vin. Therefore, an increase in the input voltage Vin results in a decrease in the operation voltage of the NAND circuit 31*a* and INV circuits 31*b*, 31*c*, 31*d* to 31*x* in the first ring delay line 31 and in an increase in the operation voltage of the NAND circuit 41*a* and INV circuits 41*b*, 41*c*, 41*d* to 41*x* in the second ring delay line 41. Conversely, a decrease in the input voltage Vin results in an increase in the operation voltage of the NAND circuit 31*a* and INV circuits 31*b*, etc. in the first ring delay line 31 and in a decrease in the operation voltage of the NAND circuit 41*a* and INV circuits 41*b*, etc. in the second ring delay line 41.

Namely, while the first ring delay line 31 receives the input voltage Vin as the operation voltage, the second ring delay line 41 receives, as the operation voltage, an inverted analog voltage signal equivalent to the one produced by inverting the input voltage Vin in the increasing/decreasing direction based on nearly an intermediate voltage in the range in which the input voltage Vin varies. Therefore, the second digital data possesses output characteristics inverted in the increasing/decreasing direction of the input voltage Vin relative to the first digital data with the intermediate voltage Vref as a reference. Therefore, the subtracted result produced by subtracting the second digital data from the first digital data is output as a binary digital data to the output line 420*f*, to thereby cancel the non-linearity of the first ring delay line 31 by the non-linearity of the second ring delay line 41. Further, no inverting amplifier 50, 250 is required that are used in the A/D converter circuits 20, 120, 220 of the first to third embodiments, making it possible to suppress the circuit scale correspondingly.

The reference voltage Vref2 is input as the power supply voltage to the third ring delay line 271 in the timing generator unit 270. Further, the third counter 272 counts the number of times of circulation of the pulse signal circulating in the third ring delay line 271 under nearly the same temperature environment as the first ring delay line 31 of the first converter unit 430 and the second ring delay line 41 of the second converter unit 440. A time point at which the counted value reaches the predetermined value is output (notified) as the latch signal at the predetermined time point to the first latch and encoder 32 and latch 34 of the first converter unit 430 and to the second latch and encoder 42 and latch 44 of the second converter unit 440. Therefore, the binary digital data DT is produced the above time point canceling the temperature characteristics of the first ring delay line 31 and of the second ring delay line 41 by the temperature characteristics of the third ring delay line 271.

That is, the analog voltage input to the third ring delay line 271 is the reference voltage Vref2 output from the constant-voltage source 371 which is almost free from the temperature variation and, therefore, the predetermined time point produced based on the number of times of circulation of the third ring delay line 271 varies depending only upon the temperature characteristics of the third ring delay line 271. The first ring delay line 31 of the first converter unit 430 and the second ring delay line 41 of the second converter unit 440 vary the output characteristics thereof accompanying a change in the ambient temperature like the third ring delay line 271 of the timing generator unit 270. Therefore, the temperature characteristics of the first ring delay line 31 and of the second ring delay line 41 can be canceled by the temperature characteristics of the third ring delay line 271. On the other hand, the digital data corresponding to the difference of the analog signal from the reference voltage Vref2 is produced as the binary digital data DT canceling the non-linearity of the first ring delay line 31 by the non-linearity of the second ring delay line 41. It is therefore made possible to also suppress variation in the digital data DT caused by a change in the ambient temperature and, accordingly, to further improve the precision inclusive of the linearity of the A/D-converted output without requiring a complex operation.

In the fifth embodiment, the time point of the latch signal is varied depending upon the temperature characteristics of the third ring delay line 271 to cancel the temperature characteristics of the first ring delay line 31 and of the second ring delay line 41. The temperature characteristics, however, may be cancelled by any other method.

In the above embodiments, the digital operation circuits 60, 260, 360 and 460 are provided in the A/D converter circuits 20, 120, 220, 320 and 420. These circuits, however, may be provided on the outer side thereof to execute the operation. This further simplifies the circuit structures of the A/D converter circuits 20, 120, 220, 320 and 420, and decreases the sizes.

What is claimed is:

1. An A/D converter circuit for converting an analog voltage signal input to an input signal line into a binary digital data and outputting the same to an output data line, the A/D converter circuit comprising:

a first pulse circulating circuit in which a plurality of inverting circuits is coupled together like a ring, the plurality of inverting circuits using the analog voltage signal input from the input signal line as a power supply voltage, and of which an inverting operation time for inverting and outputting the input signal varying depending upon the power supply voltage, one of the plurality of inverting circuits being configured as a start-up inverting circuit of which the inverting operation can be controlled from an outer side, and the pulse signal circulating in response to a start of operation of the start-up inverting circuit;

a first counter for counting the number of times of circulation of the pulse signal circulating in the first pulse circulating circuit and for outputting a counted value;

a first latch for holding a counted value output from the first counter as data of last time for a predetermined period and for outputting the same;

first operation means which regards the counted value output from the first counter as a present data, subtracts, from the present data, the data of the last time output from the first latch that has stored the data at a time point one period before the time point at which the present data was output, and outputs a subtracted result as a first digital data;

inverting means that inverts the analog voltage signal in an increasing/decreasing direction based on nearly an intermediate voltage in a range of the power supply voltage in which the first digital data output from the first operation means varies nearly constantly relative to a change in the power supply voltage, and outputs an inverted analog voltage signal;

a second pulse circulating circuit in which inverting circuits that use the inverted analog voltage signal as a power supply voltage signal and of which the inverting operation time for outputting an input signal in an inverted manner varies depending upon the power supply voltage, are connected in the same number and in the same manner as the inverting circuits that constitute the first pulse circulating circuit, one of the plurality of inverting circuits being configured as a start-up inverting circuit of which the inverting operation can be controlled from the outer side, and the pulse signal circulating in response to a start of operation of the start-up inverting circuit;

a second counter for counting the number of times of circulation of the pulse signal circulating in the second pulse circulating circuit and for outputting a counted value;

a second latch for holding a counted value output from the second counter as inverted data of last time for a predetermined period and for outputting the same;

second operation means which regards the counted value output from the second counter as a present inverted data, subtracts, from the present inverted data, the inverted data of the last time output from the second latch that has stored the data at a time point one period before the time point at which the present inverted data was output, and outputs a subtracted result as a second digital data; and third operation means for subtracting the second digital data from the first digital data and for outputting a subtracted result to the output data line as the binary digital data.

2. The A/D converter circuit according to claim 1, wherein the first pulse circulating circuit and the second pulse circulating circuit are arranged on a same semiconductor substrate adjacent and in parallel with each other.

3. An A/D converter circuit for converting an analog voltage signal input to an input signal line into a binary digital data and outputting the same to an output data line, the A/D converter circuit comprising:

signal selection means for selecting either an analog voltage signal input from the input signal line or another analog voltage signal depending upon an input of a selection control signal and outputting a selected signal;

a pulse circulating circuit in which a plurality of inverting circuits is coupled together like a ring, the plurality of inverting circuits using the analog voltage signal output from the signal selection means as a power supply voltage, and of which an inverting operation time for inverting and outputting the input signal varying depending upon the power supply voltage, one of the plurality of inverting circuits being configured as a start-up inverting circuit of which an inverting operation is controlled from an outer side, and the pulse signal circulating in response to a start of operation of the start-up inverting circuit;

a counter for counting the number of times of circulation of the pulse signal circulating in the pulse circulating circuit and for outputting a counted value;

inverting means that inverts the analog voltage signal in the increasing/decreasing direction based on nearly an intermediate voltage in a range of the power supply voltage in which the counted value output from the counter varies nearly constantly relative to a change in the power supply voltage, and outputs the inverted analog voltage signal;

voltage signal-holding means for holding either one of the input analog voltage signal or the inverted analog voltage signal and for outputting a held analog voltage signal so that the signal selection means receives the inverted analog voltage signal;

control means for outputting a non-inverted selection signal which is for selecting and outputting the analog voltage signal input from the input signal line and an inverted selection signal which is for selecting and outputting the inverted analog voltage signal as the another analog voltage signal, to the signal selection means as selection control signals;

a first latch which, when the non-inverted selection signal is input to the signal selection means, holds the counted value output from the counter as data of the last time for a predetermined period and outputs the same;

an additional latch for holding the counted value output from the counter at a time point one period after the time point for holding the data of the last time, as a present data for the predetermined period, and for outputting the same;

first operation means for subtracting the data of the last time output by the first latch from the present data output by the additional latch, and for outputting a subtracted result as a first digital data;

a second latch which, when the inverted selection signal is input to the signal selection means and when the inverted analog voltage signal held by the voltage signal-holding means is used as the power supply voltage at a time point of holding the data of the last time, holds the counted value output from the counter as an inverted data of the last time for a predetermined period, and outputs the same;

second operation means which, when the inverted selection signal is input to the signal selection means and when the inverted analog voltage signal held by the voltage signal-holding means is used as the power supply voltage at a time point one period after the time point of holding the data of the last time, regards the counted value output from the counter as the present inverted data, and subtracts the inverted data of the last time output by the second latch from the present inverted data, and outputs a subtracted result as a second digital data; and third operation means for subtracting the second digital data from the first digital data and for outputting a subtracted result to the output data line as the binary digital data.

4. The A/D converter circuit according to claim 3, further comprising:

another voltage signal-holding means is provided between the input signal line and the inverting means for holding the analog voltage signal and outputting the analog voltage signal to the inverting means, wherein the inverting means inverts the analog voltage signal output from the signal-holding means to the inverted analog voltage signal.

5. An A/D converter circuit for converting an analog voltage signal input to an input signal line into a binary digital data and outputting the same to an output data line, the A/D converter circuit comprising:

a first pulse circulating circuit in which a plurality of inverting circuits is coupled together like a ring, the plurality of inverting circuits using the analog voltage signal input from the input signal line as a power supply voltage, and of which an inverting operation time for inverting and outputting the input signal varying depending upon the power supply voltage, one of the plurality of inverting circuits being configured as a start-up inverting circuit of which an inverting operation is controlled from an outer side, and the pulse signal circulating in response to a start of operation of the start-up inverting circuit;

a first counter for counting the number of times of circulation of the pulse signal circulating in the first pulse circulating circuit and for outputting a counted value;

first output control means for outputting the counted value from the first counter as a first digital data at a predetermined time point;

inverting means that inverts the analog voltage signal in an increasing/decreasing direction based on nearly an intermediate voltage in a range of the power supply voltage in which the first digital data value output from the first output control means varies nearly constantly relative to a change in the power supply voltage, and outputs the inverted analog voltage signal;

a second pulse circulating circuit in which inverting circuits that use the inverted analog voltage signal as a power supply signal and of which the inverting operation time for outputting the input signal in an inverted manner varies depending upon the power supply voltage, are connected in the same number and in the same manner as the inverting circuits that constitute the first pulse circulating circuit, one of the plurality of inverting circuits being configured as a start-up inverting circuit of which the inverting operation is controlled from an outer side, and the pulse signal circulating in response to a start of operation of the start-up inverting circuit;

a second counter for counting the number of times of circulation of the pulse signal circulating in the second pulse circulating circuit and for outputting a counted value;

second output control means for outputting the counted value from the second counter as a second digital data at the predetermined time point;

a third pulse circulating circuit in which inverting circuits that use a predetermined reference voltage as a power supply voltage and of which an inverting operation time for outputting the input signal in an inverted manner varies depending upon the power supply voltage, are connected in the same number and in the same manner as the inverting circuits that constitute the first pulse circulating circuit, one of the plurality of inverting circuits starting an operation simultaneously with a start of operation of the start-up inverting circuit in the first pulse circulating circuit, and the inverting circuits and the start-up inverting circuit being configured to be thermally coupled to the first pulse circulating circuit;

a third counter for counting the number of times of circulation of the pulse signal circulating in the third pulse circulating circuit and for outputting a counted value; and operation means for subtracting the second digital data output by the second output control means from the first digital data output by the first output control means to obtain a subtracted result, and for canceling temperature characteristics by temperature characteristics of the counted value output by the third counter to output the result to the output data line as the binary digital data.

6. The A/D converter circuit according to claim 5, wherein the first pulse circulating circuit, the second pulse circulating circuit and the third pulse circulating circuit are arranged on a same semiconductor substrate adjacent and in parallel with each other.

7. The A/D converter circuit according to claim 5, further comprising:

a filter circuit, interposed between the reference voltage source for generating the intermediate voltage and a DC voltage source for feeding a DC voltage to the reference voltage source, for suppressing a variation in the DC voltage.

8. An A/D converter circuit for converting an analog voltage signal input to an input signal line into a binary digital data and outputting the same to an output data line, the A/D converter circuit comprising:

a first pulse circulating circuit in which a plurality of inverting circuits is coupled together like a ring, the plurality of inverting circuits using the analog voltage signal input as a reference operation voltage and a voltage twice as great as nearly an intermediate voltage in a range in which the analog voltage signal varies as an operation power supply voltage, and of which an inverting operation time for inverting and outputting the input signal varying depending upon the operation power supply voltage, one of the plurality of inverting circuits being configured as a start-up inverting circuit of which the inverting operation is controlled from an outer side, and the pulse signal circulating in response to a start of operation of the start-up inverting circuit;

a first counter for counting the number of times of circulation of the pulse signal circulating in the first pulse circulating circuit and for outputting a counted value;

a first latch for holding the counted value output from the first counter as data of last time for a predetermined period and for outputting it;

first operation means which regards the counted value output from the first counter as a present data, subtracts, from the present data, the data of the last time output from the first latch that has stored the data at a time point one period before the time point at which the present data was output, and outputs a subtracted result as a first digital data;

a second pulse circulating circuit in which inverting circuits that use a predetermined voltage lower than a minimum voltage of the analog voltage signal as a reference operation voltage and the analog voltage signal as the operation power supply voltage and of which the inverting operation time for inverting and outputting the input signal varies depending upon the operation power supply voltage, are connected in the same number and in the same manner as the inverting circuits that constitute the first pulse circulating circuit, a start-up inverting circuit which is one of the plurality of inverting circuits starting the operation simultaneously with the start of operation of the start-up inverting circuit in the first pulse circulating circuit to circulate the pulse signal;

a second counter for counting the number of times of circulation of the pulse signal circulating in the second pulse circulating circuit and for outputting a counted value;

a second latch for holding the counted value output from the second counter as inverted data of last time for a predetermined period and for outputting the same;

second operation means which regards the counted value output from the second counter as a present inverted data, subtracts, from the present inverted data, the inverted data of the last time output from the second latch that has stored the data at a time point one period before the time point at which the present inverted data was output, and outputs the subtracted result as a second digital data; and third operation means for subtracting the second digital data from the first digital data and for outputting a subtracted result to the output data line as the binary digital data.

9. The A/D converter circuit according to claim 8, wherein the inverting circuits in the first pulse circulating circuit and the inverting circuits in the second pulse circulating circuit are configured by MOS transistors formed on a same semiconductor substrate adjacent to each other, back gates of MOS transistors constituting the inverting circuits in the first pulse circulating circuit and back gates of MOS transistors constituting the inverting circuits in the second pulse circulating circuit are electrically isolated from substrate potential of the semiconductor substrate to assume different potentials.

10. An A/D converter circuit for converting an analog voltage signal input to an input signal line into a binary digital data and outputting it to an output data line, the A/D converter circuit comprising:

a first pulse circulating circuit in which a plurality of inverting circuits is coupled together like a ring, the plurality of inverting circuits using the analog voltage signal input as a reference operation voltage and a voltage twice as great as nearly an intermediate voltage in a range in which the analog voltage signal varies as an operation power supply voltage, and of which an inverting operation time for inverting and outputting the input signal varying depending upon the operation power supply voltage, one of the plurality of inverting circuits being configured as a start-up inverting circuit of which the inverting operation is controlled from an outer side, and the pulse signal circulating in response to a start of operation of the start-up inverting circuit;

a first counter for counting the number of times of circulation of the pulse signal circulating in the first pulse circulating circuit and for outputting a counted value;

first output control means for outputting the counted value from the first counter as a first digital data at a predetermined time point;

a second pulse circulating circuit in which inverting circuits that use a predetermined voltage lower than a minimum voltage of the analog voltage signal as a reference operation voltage and the analog voltage signal as the operation power supply voltage and of which the inverting operation time for inverting and outputting the input signal varies depending upon the operation power supply voltage, are connected in the same number and in the same manner as the inverting circuits that constitute the first pulse circulating circuit, a start-up inverting circuit which is one of the plurality of inverting circuits starting the operation simultaneously with the start of operation of the start-up inverting circuit in the first pulse circulating circuit to circulate the pulse signal;

a second counter for counting the number of times of circulation of the pulse signal circulating in the second pulse circulating circuit and for outputting a counted value;

second output control means for outputting the counted value from the second counter as a second digital data at the predetermined time point;

a third pulse circulating circuit in which inverting circuits that use the predetermined reference voltage as a power supply voltage and of which the inverting operation time for outputting the input signal in an inverted manner varies depending upon the power supply voltage, are connected in the same number and in the same manner as the inverting circuits that constitute the first pulse circulating circuit, one of the plurality of inverting circuits starting the operation simultaneously with the start of operation of the start-up inverting circuit in the first pulse circulating circuit, and the inverting circuits and the start-up inverting circuit being configured to be thermally coupled to the first pulse circulating circuit;

a third counter for counting the number of times of circulation of the pulse signal circulating in the third pulse circulating circuit and for outputting a counted value; and operation means for subtracting the second digital data output by the second output control means from the first digital data output by the first output control means to obtain a subtracted result, and for canceling temperature characteristics by temperature characteristics of the counted value output by the third counter to output the result to the output data line as the binary digital data.

11. The A/D converter circuit according to claim 10, wherein the inverting circuits in the first pulse circulating circuit and the inverting circuits in the second pulse circulating circuit are configured by MOS transistors formed on a same semiconductor substrate adjacent to each other, back gates of MOS transistors constituting the inverting circuits in the first pulse circulating circuit and back gates of MOS transistors constituting the inverting circuits in the second pulse circulating circuit are electrically isolated from a substrate potential of the semiconductor substrate to assume different potentials.

12. An A/D conversion method for converting an analog voltage signal input to an input signal line into a binary digital data and outputting the same to an output data line, the A/D conversion method comprising:
  supplying the analog voltage signal to a first pulse circulating circuit in which a plurality of inverting circuits is coupled in a ring form, so that the plurality of inverting circuits operates with the analog voltage signal as a power supply voltage and circulates a pulse signal therein;
  counting the number of times of circulation of the pulse signal in the first pulse circulating circuit and for outputting a first counted value;
  subtracting, from a present data of a first counted value counted presently, a last data of a first counted value counted at a time point one period before the present data is output, to output a subtracted result as a first digital data;
  inverting the analog voltage signal to output an inverted analog voltage signal, which oppositely increases and decreases relative to the analog voltage signal with respect to a nearly an intermediate voltage in a range of the power supply voltage in which the first digital data varies nearly constantly relative to a change in the power supply voltage;
  supplying, as another power supply voltage, the inverted analog voltage signal to a second pulse circulating circuit in which a plurality of inverting circuits is coupled in a ring form, so that the plurality of inverting circuits operates with the inverted analog voltage signal and circulates the pulse signal therein;
  counting the number of times of circulation of the pulse signal in the second pulse circulating circuit and for outputting a second counted value;
  subtracting, from a present data of a second counted value counted presently, a last data of a second counted value counted at a time point one period before the present data is output, to output a subtracted result as a second digital data; and
  combining the first digital data and the second digital data and outputting a combined result to the output data line as the binary digital data.

13. The A/D conversion method according to claim 12, wherein:
  both the first pulse circulating circuit and the second pulse circulating circuit are provided by a single pulse circulating circuit; and
  the analog voltage signal and the inverted analog voltage signal are alternately supplied to the single pulse circulating circuit.

14. An A/D conversion method for converting an analog voltage signal input to an input signal line into a binary digital data and outputting the same to an output data line, the A/D conversion method comprising:
  supplying a reference voltage signal and the analog voltage signal to a first pulse circulating circuit in which a plurality of inverting circuits is coupled in a ring form, so that the plurality of inverting circuits operates with the reference voltage signal relative to the analog voltage signal and circulates a pulse signal therein, wherein the reference voltage signal is fixed and unchanged irrespective of a surrounding temperature of the first pulse circulating circuit;
  counting the number of times of circulation of the pulse signal in the first pulse circulating circuit and for outputting a first counted value;
  subtracting, from a present data of a first counted value counted presently, a last data of a first counted value counted at a time point one period before the present data is output, to output a subtracted result as a first digital data;
  supplying the analog voltage signal to a second pulse circulating circuit in which a plurality of inverting circuits is coupled in a ring form, so that the plurality of inverting circuits operates with the analog voltage signal and circulates a pulse signal therein;
  counting the number of times of circulation of the pulse signal in the second pulse circulating circuit and for outputting a second counted value;
  subtracting, from a present data of a second counted value counted presently, a last data of a second counted value counted at a time point one period before the present data is output, to output a subtracted result as a second digital data; and
  combining the first digital data and the second digital data and outputting a combined result to the output data line as the binary digital data.

* * * * *